United States Patent
Cha et al.

(10) Patent No.: US 8,575,702 B2
(45) Date of Patent: Nov. 5, 2013

(54) SEMICONDUCTOR DEVICE AND METHOD FOR FABRICATING SEMICONDUCTOR DEVICE

(75) Inventors: Jae-Han Cha, Cheongju-Si (KR);
Kyung-Ho Lee, Cheongju-Si (KR);
Sun-Goo Kim, Cheongju-Si (KR);
Hyung-Suk Choi, Cheongju-Si (KR);
Ju-Ho Kim, Cheongju-Si (KR);
Jin-Young Chae, Cheongju-Si (KR);
In-Taek Oh, Cheongju-Si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 61 days.

(21) Appl. No.: 12/882,826

(22) Filed: Sep. 15, 2010

(65) Prior Publication Data

US 2011/0127612 A1    Jun. 2, 2011

(30) Foreign Application Priority Data

Nov. 27, 2009   (KR) .................. 10-2009-0115906
Nov. 27, 2009   (KR) .................. 10-2009-0116052
Nov. 27, 2009   (KR) .................. 10-2009-0116075

(51) Int. Cl.
*H01L 21/70*       (2006.01)
(52) U.S. Cl.
USPC ........... 257/368; 438/294; 438/157; 257/339; 257/335; 257/336; 257/328; 257/147
(58) Field of Classification Search
USPC ......... 257/368, 339, 335–336, 328, 147, 401; 438/294, 157
See application file for complete search history.

(56) References Cited

U.S. PATENT DOCUMENTS

| | | | |
|---|---|---|---|
| 5,747,850 A * | 5/1998 | Mei | 257/328 |
| 6,180,986 B1 * | 1/2001 | Ishida | 257/368 |
| 6,424,005 B1 | 7/2002 | Tsai et al. | |
| 6,750,507 B2 * | 6/2004 | Williams et al. | 257/328 |
| 6,835,624 B2 * | 12/2004 | Pong et al. | 438/286 |

(Continued)

FOREIGN PATENT DOCUMENTS

KR    10-2009-0119567 A    11/2009

OTHER PUBLICATIONS

Korean Office Action, issued in Korean Patent Application No. 10-2009-0116075, dated Feb. 17, 2011 (4 pages).

(Continued)

*Primary Examiner* — Fernando L Toledo
*Assistant Examiner* — Mohammed Shamsuzzaman
(74) *Attorney, Agent, or Firm* — NSIP Law

(57) ABSTRACT

A semiconductor device includes: an active region configured over a substrate to include a first conductive-type first deep well and second conductive-type second deep well forming a junction therebetween. A gate electrode extends across the junction and over a portion of first conductive-type first deep well and a portion of the second conductive-type second deep well. A second conductive-type source region is in the first conductive-type first deep well at one side of the gate electrode whereas a second conductive-type drain region is in the second conductive-type second deep well on another side of the gate electrode. A first conductive-type impurity region is in the first conductive-type first deep well surrounding the second conductive-type source region and extending toward the junction so as to partially overlap with the gate electrode and/or partially overlap with the second conductive-type source region.

14 Claims, 20 Drawing Sheets

(56) References Cited

U.S. PATENT DOCUMENTS

| | | |
|---|---|---|
| 7,176,091 B2 | 2/2007 | Pendharkar |
| 7,211,863 B2* | 5/2007 | Williams et al. .............. 257/338 |
| 7,427,795 B2 | 9/2008 | Pendharkar |
| 7,868,394 B2* | 1/2011 | Kao ............................. 257/401 |
| 7,943,445 B2* | 5/2011 | Anderson et al. ............. 438/157 |
| 2002/0050619 A1* | 5/2002 | Kawaguchi et al. .......... 257/368 |
| 2005/0087800 A1* | 4/2005 | Sugi et al. .................... 257/328 |
| 2005/0199968 A1* | 9/2005 | Matsui et al. ................. 257/412 |
| 2007/0120184 A1* | 5/2007 | Cai et al. ...................... 257/335 |
| 2008/0061367 A1* | 3/2008 | Williams et al. ............. 257/336 |
| 2008/0308874 A1* | 12/2008 | Letavic et al. ................ 257/369 |
| 2009/0203179 A1* | 8/2009 | Fukumoto et al. ............ 438/294 |
| 2010/0163983 A1* | 7/2010 | Choi ............................. 257/336 |
| 2011/0073906 A1* | 3/2011 | Bobde et al. .................. 257/147 |
| 2011/0133277 A1* | 6/2011 | Cha et al. ...................... 257/339 |
| 2011/0147808 A1* | 6/2011 | Anderson et al. ............. 257/272 |
| 2012/0211832 A1* | 8/2012 | Chu et al. ...................... 257/335 |

OTHER PUBLICATIONS

Chinese Office Action issued Nov. 5, 2012 in counterpart Chinese Patent Application No. 201010565374.X (10 pages including English translation).

* cited by examiner

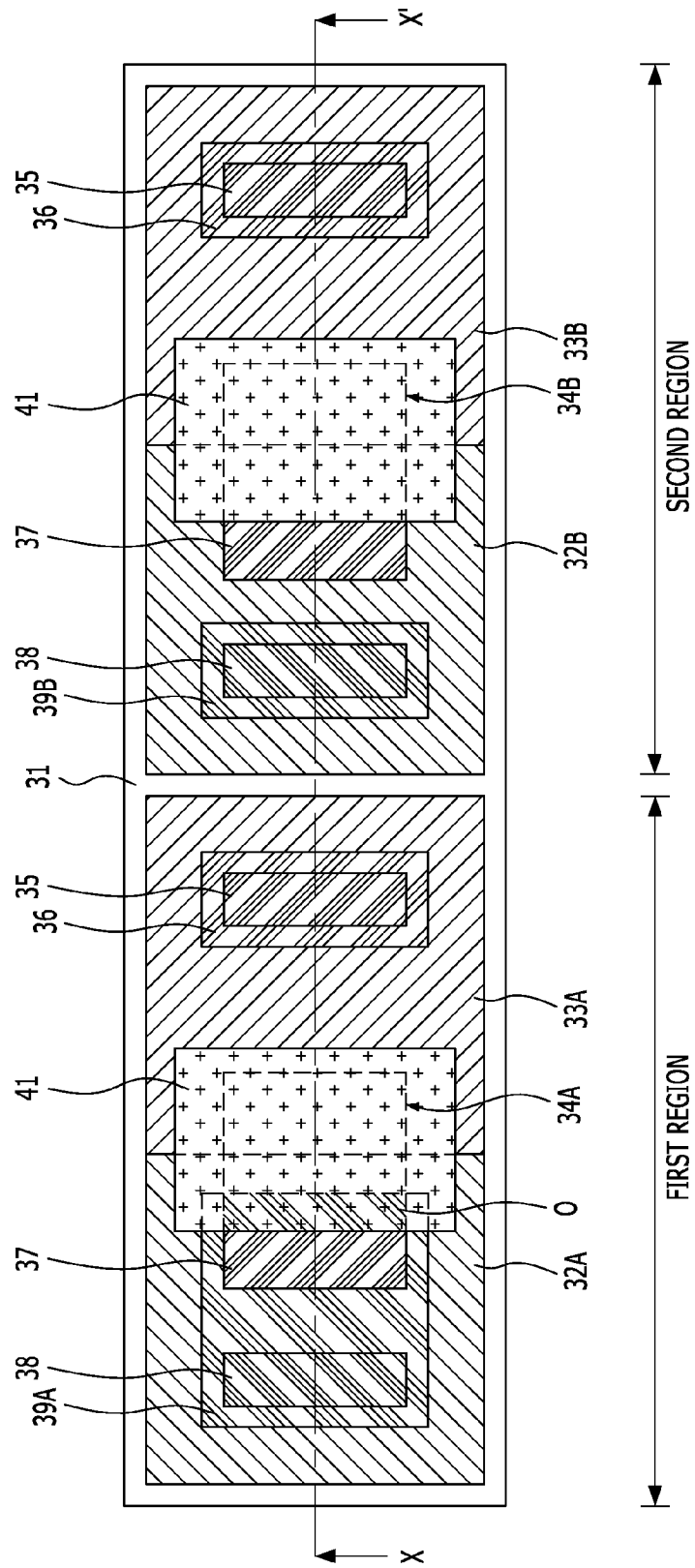

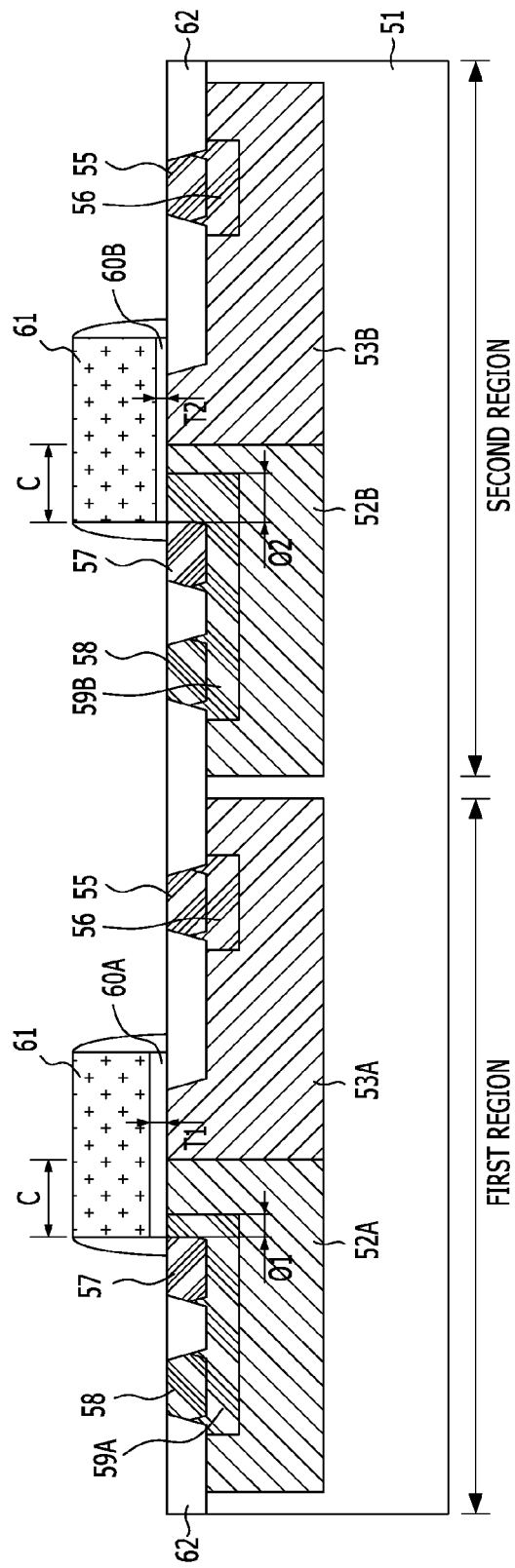

SEMICONDUCTOR DEVICE AND METHOD FOR FABRICATING SEMICONDUCTOR DEVICE

CROSS-REFERENCE TO RELATED APPLICATIONS

The present application claims the benefit under 35 U.S.C. §119(a) of Korean Patent Application No. 10-2009-0115906, filed on Nov. 27, 2009, Korean Patent Application No. 10-2009-0116052, filed on Nov. 27, 2009, and Korean Patent Application No. 10-2009-0116075, filed on Nov. 27, 2009, the entire disclosures of which are incorporated herein by reference for all purposes.

TECHNICAL FIELD

The following description relates generally to a semiconductor device; and, more particularly, to a semiconductor device for controlling power and a method for fabricating a semiconductor device for controlling power.

BACKGROUND OF RELATED ART

A semiconductor device for controlling power has a structure where a plurality of transistors having different fabrication factors, such as impurity doping concentration in an active region, thickness of a gate insulation layer and the like, according to the desired characteristics are integrated in one substrate. The semiconductor device for controlling power uses many expanded drain MOS (EDMOS) transistors. It is well known that when a semiconductor device for controlling power is designed, a threshold voltage VT should be secured while maintaining a breakdown voltage BV desired for the transistors.

EDMOS transistors are commonly used in a high voltage semiconductor device and have higher input impedance than that of bipolar transistors. Accordingly, a power gain of an EDMOS transistor may be comparatively large, and a gate driving circuit may be more simply implemented. Also, because the EDMOS transistor is a unipolar device, delay does not occur or is prevented, where the delay occurs due to accumulation or recombination of minority carriers during an extended turn-off.

FIGS. 1A to 1C illustrate a conventional semiconductor device for controlling power. FIG. 1A is a plan view. FIG. 1B is a cross-sectional view of the conventional semiconductor device for controlling power shown in FIG. 1A taken along the line X-X'. FIG. 1C is a cross-sectional view of the conventional semiconductor device for controlling power shown in FIG. 1A taken along the line Y-Y'. In the drawings, a semiconductor device for controlling power including EDMOS transistors each having an N channel is illustrated as an example.

Referring to FIGS. 1A to 1C, the conventional semiconductor device for controlling power will be described hereafter. EDMOS transistors are formed in the respective regions of a substrate 11 including a first region and a second region, where the second region has a relatively lower operation voltage than the first region. Herein, each of the EDMOS transistors includes a P-type first deep well 12A or 12B and an N-type second deep well 13A or 13B formed over the substrate 11, an active region 14A or 14B, a gate electrode 21, a gate insulation layers 20A or 20B, an N-type source region 17, a P-type pickup region 18, a P-type first impurity region 19, an N-type drain region 15 and an N-type second impurity region 16.

The active regions 14A and 14B are defined by a device isolation layer 22 formed over a substrate 11, and have a structure where the P-type first deep wells 12A are junctioned respectively with 12B and the N-type second deep wells 13A and 13B. The gate electrode 21 crosses both the P-type first deep well 12A or 12B and the N-type second deep well 13A or 13B over the substrate 11. The gate insulation layers 20A and 20B are interposed between the gate electrode 21 and the substrate 11. The N-type source region 17 is formed over the P-type first deep wells 12A and 12B adjacent one end of the gate electrode 21. The P-type pickup region 18 is formed over the P-type first deep wells 12A and 12B to be spaced apart from the N-type source region 17 by a predetermined distance. The P-type first impurity region 19 is formed over the P-type first deep wells 12A and 12B to surround the P-type pickup region 18. The N-type drain region 15 is formed over the N-type second deep wells 13A and 13B to be spaced apart from, and on the opposite side from the N-type source region 17 of, the gate electrode 21. The N-type second impurity region 16 is formed over the N-type second deep wells 13A and 13B to surround the N-type drain region 15.

Herein, since the gate insulation layer 20A and the gate insulation layer 20B are simultaneously formed in a first region and a second region, respectively, during the fabrication of the semiconductor device for controlling power, the gate insulation layers 20A and 20B formed in the first and second regions respectively have substantially the same thickness (i.e., T1=T2) in order to simplify the process for fabricating a semiconductor device for controlling power. Therefore, an EDMOS transistor formed in the first region, which has a greater operation voltage than an EDMOS transistor formed in the second region, can secure a sufficient breakdown voltage only when the impurity doping concentrations of the P-type first deep well 12A and the N-type second deep well 13A formed in the first region is lower than the impurity doping concentrations of the P-type first deep well 12B and the N-type second deep well 13B.

When the impurity doping concentrations of the P-type first deep well 12A and the N-type second deep well 13A formed in the first region is lower in the conventional semiconductor device for controlling power, the threshold voltage values of the EDMOS transistor formed in the first region may decrease below the desired threshold voltage level due to the low impurity doping concentrations of the P-type first deep well 12A and the N-type second deep well 13A. To solve this problem, additional impurity may be implanted into the channel region C of the EDMOS transistor formed in the first region (see the portion marked 'A' in FIG. 1B) through an additional mask process or an ion implantation process so as to secure the threshold voltage. When such method is used, the number of the procedural steps of the process for fabricating a semiconductor device for controlling power is increased, resulting in an increase in the production costs and time. Herein, the channel region C of the EDMOS transistor may be defined as the surface area of the substrate 11 where the gate electrode 21 overlaps with the P-type first deep well 12A in the active regions 14A or with the P-type first deep well 12B in the active regions 14B. That is, the channel region C of the EDMOS transistor in the first region may be defined as the surface area of the substrate 11 corresponding to the area of overlap between the P-type first deep wells 12A of the active regions 14A and the gate electrode 21. It should be noted that the channel region C may have a width that is narrower than the entire width of overlap between the gate electrode 21 and the P-type first deep well 12A over the entire depth into the substrate 11. That is, when, for example, as shown in FIG. 1C, a device isolation layer 22 is formed to create the sidewalls B of the P-type first deep well 12A so as to result in a narrower P-type first deep well 12A at the surface of the substrate 11, it is the overlapping area of the substrate surface that defines the channel region C.

The device isolation layer 22 is typically formed through a shallow trench isolation (STI) process. During the processing or doping of the P-type first deep well 12A, an impurity, e.g., boron, may be impregnated to the device isolation layer 22 in a region (see a portion marked with 'H' in FIG. 1A) adjacent to both the P-type first deep well 12A and the device isolation layer 22 in a lower portion of the gate electrode 21 in a direction of channel width (which is Y-Y' direction), so that the doping concentration of the channel region C adjacent to the device isolation layer 22 may be decreased locally.

When the doping concentration of the channel region C near the device isolation layer 22 is locally decreased in the direction of channel length (which is X-X' direction), a value of a predetermined threshold voltage level is varied. Also, a hump effect can occur, and thus, operational characteristics of the semiconductor device may be deteriorated.

FIG. 1D illustrates a cross-sectional view of another conventional semiconductor device for controlling power. Again, a semiconductor device for controlling power formed of EDMOS transistors each having an N channel is illustrated as an example.

Referring to FIG. 1D, a method for fabricating the conventional semiconductor device for controlling power will be described hereafter. P-type first deep wells 12A and 12B and N-type second deep wells 13A and 13B are formed performing an impurity ion implantation onto a substrate 11 including a first region and a second region. Thereafter, a device isolation layer 22 is formed to define active regions 14A and 14B having a structure where the P-type first deep wells 12A and 12B and the N-type second deep wells 13A and 13B are junctioned with each other, respectively.

Thereafter, P-type first impurity regions 19A and 19B are formed by performing an impurity ion implantation onto a portion of the substrate 11 with the P-type first deep wells 12A and 12B formed therein, and N-type second impurity regions 16A and 16B are formed by performing an impurity ion implantation onto a portion of the substrate 11 with the N-type second deep wells 13A and 13B formed therein.

Thereafter, a mask pattern is formed to open a channel region C over the substrate 11, and a threshold voltage control layer 24A (24B) are formed over the first and second regions by using the mask pattern as an implantation barrier and performing an ion implantation process.

Thereafter, gate insulation layers 20A and 20B are formed over the substrate 11. Herein, the thickness of the gate insulation layer 20A formed in the first region is different from the thickness of the gate insulation layer 20B formed in the second region (T1≠T2).

Thereafter, a gate conductive layer is formed over the substrate 11, and the gate conductive layer and the gate insulation layers 20A and 20B are sequentially etched to thereby provide the gate insulation layers 20A and 20B and the gate electrode 21 in the first region and the second region. Thereafter, a gate is formed to cross both the P-type first deep wells 12A and 12B and the N-type second deep wells 13A and 13B.

Thereafter, P-type pickup regions 18A and 18B are formed over the P-type first impurity regions 19A and 19B, and N-type source regions 17A and 17B are formed over the P-type first deep wells 12A and 12B. N-type drain regions 15A and 15B are formed over the N-type second impurity regions 16A and 16B.

A semiconductor device for controlling power fabricated through the above-described process can have a high operation voltage. To secure a breakdown voltage characteristic, the conventional semiconductor device for controlling power is formed to have a low impurity doping concentration in the P-type first deep wells 12A and 12B and the N-type second deep wells 13A and 13B. When the impurity doping concentrations of the P-type first deep wells 12A and 12B and the N-type second deep wells 13A and 13B are brought down to secure the breakdown voltage characteristic, a threshold voltage level of a corresponding transistor is drastically decreased, which may be programmatic. Also, where the gate insulation layers 20A and 20B are provided thinner with the P-type first deep wells 12A and 12B and the N-type second deep wells 13A and 13B formed to have a low impurity doping concentration, the threshold voltage level is further decreased.

To address this, the conventional method provides the threshold voltage control layers 24A and 24B in the channel region C of the substrate 11 through a mask process and an ion implantation process. Herein, the channel region C of an EDMOS transistor may be defined as a surface area of the substrate 11 where the gate electrodes 21 and the P-type first deep wells 12A and 12B are overlapped.

However, since the threshold voltage control layers 24A and 24B should be formed to have different characteristics, such as the impurity conductive type, the kind of impurity, the amount of ion to be implanted and so forth, according each transistor formed in each region in consideration of the impurity doping concentrations of the P-type first deep wells 12A and 12B and the N-type second deep wells 13A and 13B and the thicknesses of the gate insulation layers 20A and 20B, the number of procedural steps increases as well as the production unit cost and production time.

SUMMARY OF THE DISCLOSURE

An embodiment of the present invention is directed to a semiconductor device for controlling power capable of securing suitable threshold voltage characteristics as well as suitable breakdown voltage characteristics.

Various objects and advantages of the present disclosure can be understood and will become apparent from the following description of several embodiments thereof.

In accordance with an aspect of the present disclosure, a semiconductor device includes: an active region configured in or over a substrate to include a first conductive-type first deep well and a second conductive-type second deep well that form a junction therebetween; a gate electrode extending over the junction and over a portion of the first conductive-type first deep well and a portion of the second conductive-type second deep well; a gate insulation layer interposed between the gate electrode and the substrate; a second conductive-type source region configured in the first conductive-type first deep well on one side of the gate electrode; a second conductive-type drain region configured in the second conductive-type second deep well on another side of the gate electrode; and a first conductive-type first impurity region configured in the first conductive-type first deep well, wherein the first conductive-type first impurity region extends toward the junction in such a manner forming a first overlap region in which the first conductive-type first impurity region overlaps with a portion of the gate electrode and/or a portion of the second conductive-type source region.

A threshold voltage level of the semiconductor device may be directly proportional to an impurity doping concentration of the active region or to a thickness of the gate insulation layer. The threshold voltage level may increase with an increase in an area of the first overlap region.

The first conductive-type first impurity region may have an impurity doping concentration that is higher than that in the first conductive-type first deep well.

The first overlap region may be formed in a manner in which the first conductive-type first impurity region overlaps with a portion of the gate electrode in the active region.

The first overlap region may be within a positional range from the second conductive-type source region to the junction between the first conductive-type first deep well and the second conductive-type second deep well.

At least one of a line width of the first overlap region and an area of the first overlap region may increase gradually from the second conductive-type source region toward the second conductive-type drain region.

The semiconductor device may further include a second overlap region in which the gate electrode overlaps with the first conductive-type first impurity region, the second overlap region being in an inactive region outside the active region.

The second overlap region may have a wider line width extending along a direction of channel length of the semiconductor device, that is wider than that of the first overlap region.

An impurity doping concentration of the first conductive-type first impurity region within the first overlap region may have a slope.

The impurity doping concentration of the first conductive-type first impurity region within the first overlap region may decrease gradually from the second conductive-type source region toward the second conductive-type drain region.

The second conductive-type source region may be formed in the first conductive-type first deep well adjacent one side edge of the gate electrode, the second conductive-type drain region being formed in the second conductive-type second deep well and being spaced apart from, and on opposite side from the second conductive-type source region, of the gate electrode.

The semiconductor device may further include: a device isolation layer configured over the substrate to define boundaries of the active region; a first conductive-type pickup region configured in the first conductive-type first impurity region; and a second conductive-type second impurity region configured in the second conductive-type second deep well to surround the second conductive-type drain region.

The device isolation layer may be formed through a shallow trench isolation (STI) process.

At least a portion of the device isolation layer may extend between the gate electrode and the second conductive-type drain region, and partially overlapped by a portion of the gate electrode.

The first overlap region may be formed in a manner in which the first conductive-type first impurity region overlaps with a portion of the gate electrode outside the active region.

The first overlap region may be spaced apart from the active region by a predetermined distance in a channel width direction.

The first overlap region may be positioned in a region where the first conductive-type first deep well outside the active region and the gate electrode overlap each other.

The first overlap region may not contact an interface between the first conductive-type first deep well and the second conductive-type second deep well.

An impurity doping concentration of the first conductive-type first impurity region within the overlap region may have a slope.

According to another aspect of the present disclosure, a semiconductor device includes: a semiconductor layer including a first region and a second region, the first region being of a first conductivity type, the second region being of a second conductivity type so as to form a junction with the first region at an interface between the first and second regions; a conductor extending across the junction between the first and second regions of the semiconductor layer; an impurity region of the first conductivity type formed in the first region of the semiconductor layer, the impurity region having impurity dopant in higher concentration than in portions of the first region of the semiconductor layer adjacent and outside the impurity region; and a conductive region of the second conductivity type formed in or above the impurity region, wherein the impurity region extends along a direction toward the junction so as to overlap at least a portion of the conductor.

Area of overlap between the first region of the semiconductor layer and the conductor may have substantially the same size as area of overlap between the impurity region and the conductor.

Area of overlap between the first region of the semiconductor layer and the conductor may be smaller than area of overlap between the impurity region and the conductor.

The semiconductor device may include an expanded drain metal oxide semiconductor (EDMOS) transistor, the conductor being a gate electrode of the EDMOS transistor, the conductive region being a source region of the EDMOS transistor, wherein a portion of the first region of the semiconductor layer that is adjacent and overlapping with the conductor defines a channel region of the EDMOS transistor having a channel length that extends along a first direction toward and away from the junction and a channel width extending along a second direction perpendicular to the first direction, and wherein an area of overlap between the impurity region and the conductor spans the channel length in its entirety.

The area of overlap between the impurity region and the conductor may be wider than the channel width.

The semiconductor layer may be formed in the substrate, the channel region of the EDMOS transistor extending along a surface of the substrate.

According to another aspect of the present disclosure, a method for fabricating a semiconductor device includes: forming an active region configured in or over a substrate to include a first conductive-type first deep well and a second conductive-type second deep well that form a junction therebetween; forming a first conductive-type first impurity region in the first conductive-type first deep well; forming a gate insulation layer over the substrate; forming a gate electrode extending over the junction and over a portion of the first conductive-type first deep well and a portion of the second conductive-type second deep well; and forming a second conductive-type source region in the first conductive-type first deep well on one side of the gate electrode and a second conductive-type drain region in the second conductive-type second deep well on another side of the gate electrode, wherein the first conductive-type first impurity region extends toward the junction in such a manner forming a overlap region in which the first conductive-type first impurity region overlaps with a portion of the gate electrode and/or a portion of the second conductive-type source region.

In the method, the overlap region may be formed in a manner in which the first conductive-type first impurity region overlaps with a portion of the gate electrode in the active region.

In the method, the overlap region may be within a positional range from the second conductive-type source region to the junction between the first conductive-type first deep well and the second conductive-type second deep well.

In the method, at least one of a line width of the overlap region may increase gradually from the second conductive-type source region toward the second conductive-type drain region.

In the method, the overlap region may include: a first overlap region formed in a manner in which the first conductive-type first impurity region overlaps with a portion of the gate electrode in the active region; and a second overlap region in which the gate electrode overlaps with the first conductive-type first impurity region, the second overlap region being in an inactive region outside the active region.

In the method, the first conductive-type first impurity region may have an impurity doping concentration that is higher than that in the first conductive-type first deep well.

The method may further include: forming a first conductive-type pickup region over the first conductive-type first impurity region spaced apart from the second conductive-type source region by a predetermined distance.

In the method, the second conductive-type source region and the first conductive-type pickup region may be formed within the first conductive-type first impurity region.

The method may further include: forming a device isolation layer by a shallow trench isolation (STI) process; and forming a second conductive-type second impurity region over the second conductive-type second deep well to surround the second conductive-type drain region.

In the method, at least a portion of the device isolation layer may extend between the gate electrode and the second conductive-type drain region, and partially overlapped by a portion of the gate electrode.

In the method, the overlap region may be formed by a thermal treatment.

According to another aspect of the present disclosure, a method for fabricating a semiconductor device includes: forming a semiconductor layer including a first region and a second region, the first region being of a first conductivity type, the second region being of a second conductivity type so as to form a junction with the first region at an interface between the first and second regions; forming a conductor extending across the junction between the first and second regions of the semiconductor layer; forming an impurity region of the first conductivity type formed in the first region of the semiconductor layer, the impurity region having impurity dopant in higher concentration than in portions of the first region of the semiconductor layer adjacent and outside the impurity region; and forming a conductive region of the second conductivity type formed in or above the impurity region, wherein the impurity region extends along a direction toward the junction so as to overlap at least a portion of the conductor.

In the method, area of overlap between the first region of the semiconductor layer and the conductor may be substantially the same size as area of overlap between the impurity region and the conductor.

In the method, area of overlap between the first region of the semiconductor layer and the conductor may be smaller than area of overlap between the impurity region and the conductor.

In the method, the semiconductor device may include an expanded drain metal oxide semiconductor (EDMOS) transistor, the conductor being a gate electrode of the EDMOS transistor, the conductive region being a source region of the EDMOS transistor, wherein a portion of the first region of the semiconductor layer that is adjacent and overlapping with the conductor defines a channel region of the EDMOS transistor having a channel length that extends along a first direction toward and away from the junction and a channel width extending along a second direction perpendicular to the first direction, and wherein an area of overlap between the impurity region and the conductor spans the channel length in its entirety.

In the method, the area of overlap between the impurity region and the conductor may be wider than the channel width.

Other features and aspects will be apparent from the following detailed description, the drawings, and the claims.

BRIEF DESCRIPTION OF THE DRAWINGS

Various features and advantages of the disclosure will become more apparent by the following detailed description of several embodiments thereof with reference to the attached drawings, of which:

FIGS. 2A and 2B are diagrams illustrating a semiconductor device for controlling power in accordance with an embodiment of the present disclosure;

FIGS. 3A and 3B are diagrams illustrating a semiconductor device for controlling power in accordance with another embodiment of the present disclosure;

Figure 1A:
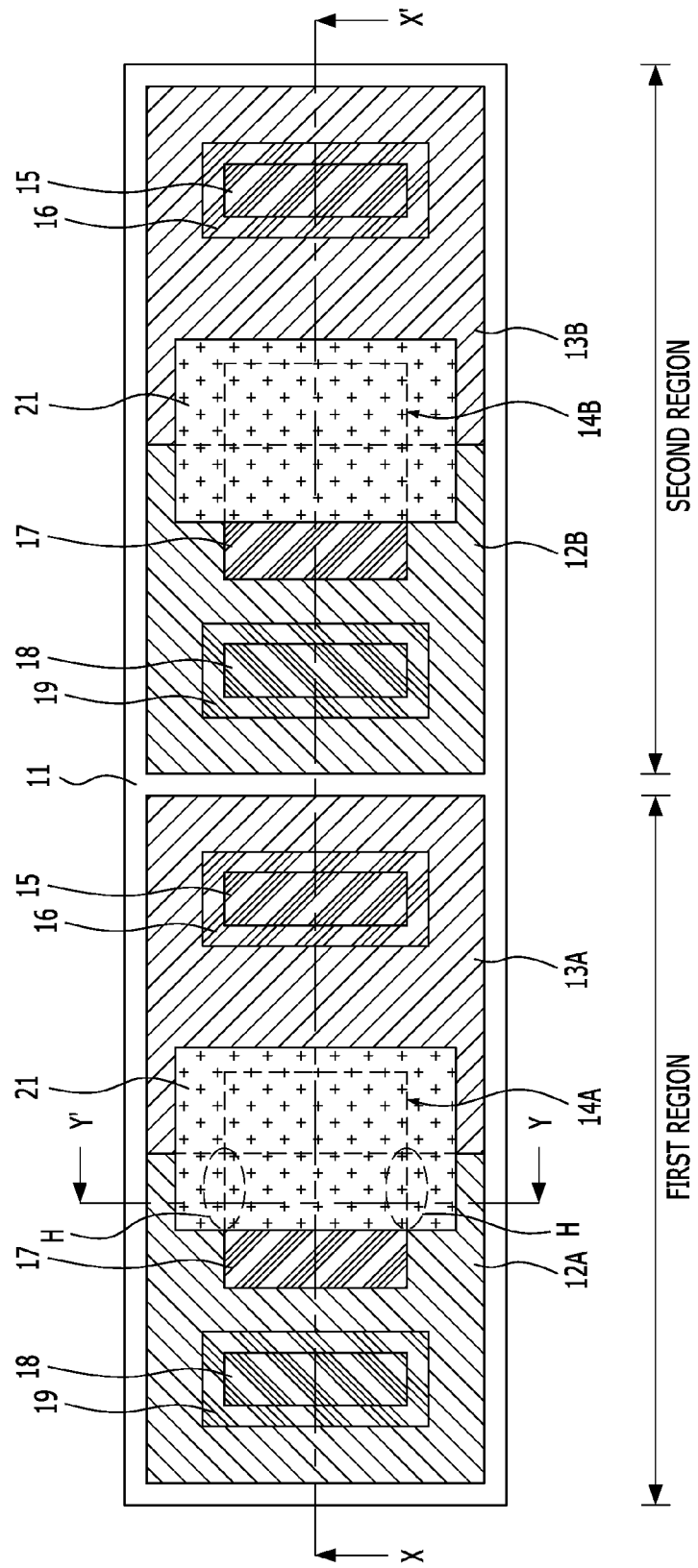
FIGS. 1A to 1C are diagrams illustrating a conventional semiconductor device for controlling power.
Figure 1B:
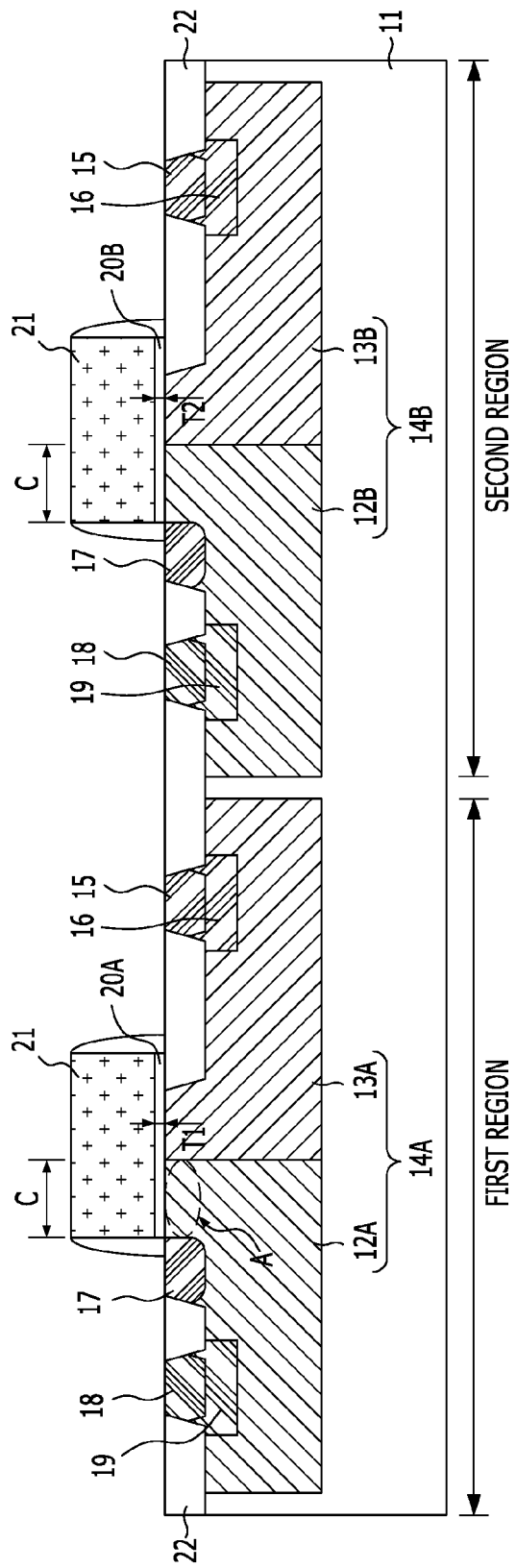
Figure 1C:
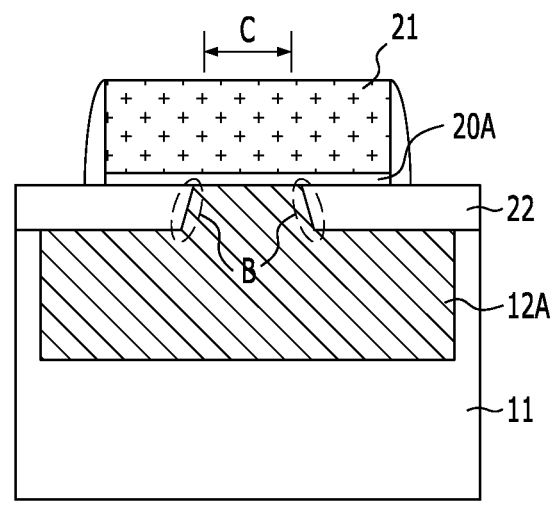
Figure 1D:
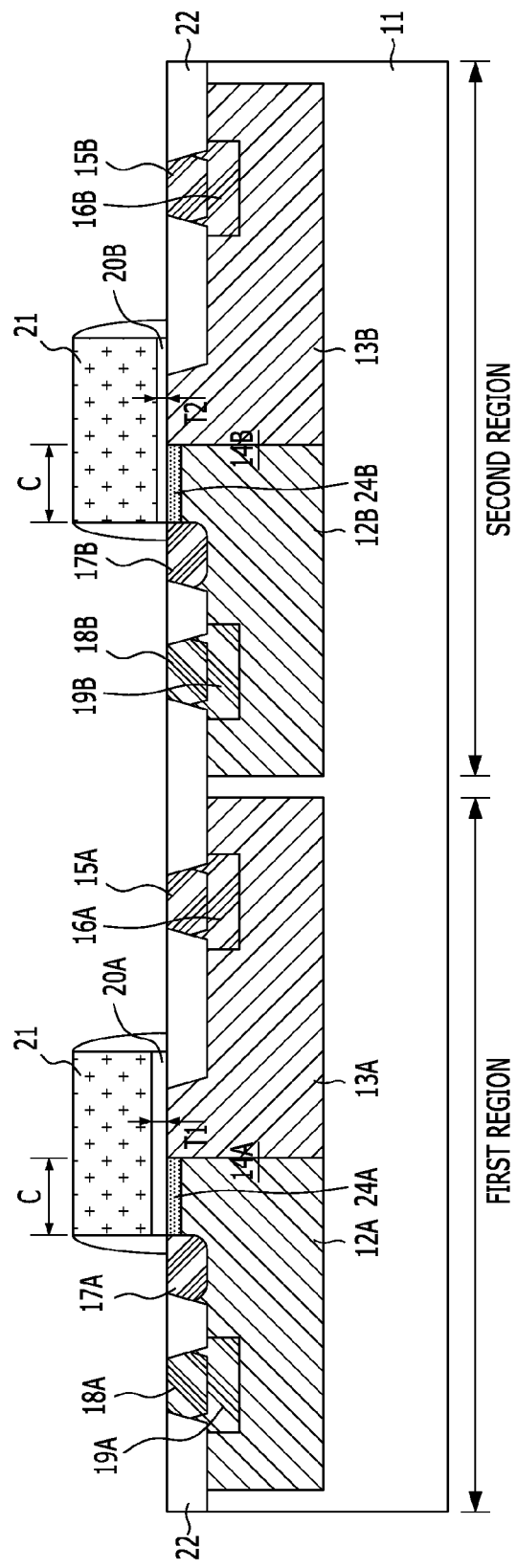
FIG. 1D is a diagram illustrating a cross-sectional view of another conventional semiconductor device for controlling power.

The relative size and depiction of these elements may be exaggerated for clarity, illustration, and convenience.

DETAILED DESCRIPTION OF SEVERAL EMBODIMENTS

Several embodiments of the present disclosure will be described below in more detail with reference to the accompanying drawings. The features of the present disclosure may, however, be embodied in different forms and should not be constructed as limited to the specific embodiments set forth herein. Rather, these embodiments are provided so that this disclosure will be thorough and complete, and will convey the full scope of the present disclosure to those skilled in the art. Throughout the disclosure, like reference numerals refer to like parts throughout the various figures and embodiments of the present disclosure. The drawings are not necessarily to scale, and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present disclosure provides a semiconductor device for controlling power that has a structure where a plurality of transistors with different fabrication factors, such as impurity doping concentration of an active region, thickness of a gate insulation layer and the like, are integrated in one substrate, and which may be capable of securing the suitable threshold voltage VT characteristics and the breakdown voltage BV characteristics. To this end, according to one or more aspects of the present disclosure, suitable threshold voltage characteristics may be realized by expanding the impurity region formed to surround the pickup region into the channel region in such a manner that the impurity region and the channel region partially overlap each other, and by controlling the line width (otherwise the area) of overlap. According to another aspect, suitable threshold voltage characteristics may be realized by expanding the impurity region formed to surround the pickup region into the gate electrode in a such manner that the impurity region and the gate electrode partially overlap each other, and by controlling the line width (or area) of the overlap.

For purposes of illustrative convenience, an expanded drain MOS (EDMOS) transistor having an N channel will be used as an example of the semiconductor device in describing the following several embodiments. Accordingly, in the following descriptions, the first conductive type corresponds to the P type whereas the second conductive type corresponds to the N type. Of course, an EDMOS transistor having a P channel could be another example of the semiconductor device, in which case, the first conductive type corresponds to the N type while the second conductive type corresponds to the P type.

According to an embodiment of the present disclosure, a semiconductor device for controlling power having gate insulation layers of the same thickness may include a plurality of transistors, the respective active regions of which may have different impurity doping concentrations from one another, may be fabricated in a single substrate, and may be capable of securing the suitable threshold voltage characteristics desired for the transistors.

Figure 2B:
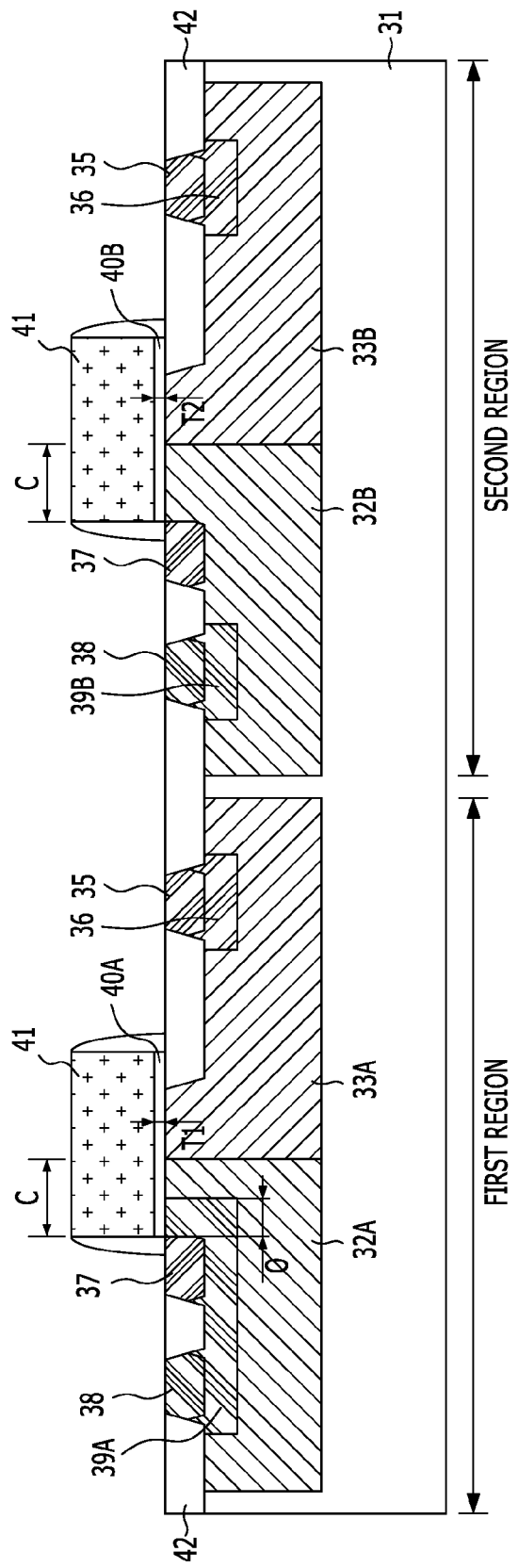

FIGS. 2A and 2B illustrate a semiconductor device for controlling power in accordance with an embodiment of the present disclosure. FIG. 2A is a plan view of such a semiconductor device for controlling power. FIG. 2B is a cross-sectional view showing the semiconductor device of FIG. 2A taken along the line X-X'.

Referring to FIGS. 2A and 2B, the semiconductor device for controlling power according to an embodiment of the present disclosure may include EDMOS transistors arranged in the first region and the second region of a substrate 31. The respective operating voltages of the EDMOS transistors may be different from one another. For the sake of convenience, in the following description, the EDMOS transistor formed in the first region will be referred to as the first transistor whereas the EDMOS transistor formed in the second region will be referred to as the second transistor. Also, it is assumed that the operating voltage of the first transistor is greater than the operating voltage of the second transistor, and that the second transistor formed in the second region already exhibits the desired breakdown voltage and threshold voltage characteristics.

The first and second transistors collectively may include the first conductive-type first deep wells 32A and 32B and the second conductive-type second deep wells 33A and 33B formed over a substrate 31, the active regions 34A and 34B, the gate electrodes 41, gate insulation layers 40A and 40B, a second conductive-type source region 37, a first conductive-type pickup region 38, first conductive-type first impurity regions 39A and 39B, a second conductive-type drain region 35 and a second conductive-type second impurity region 36.

The active regions 34A and 34B are defined by a device isolation layer 42 formed over the substrate 31, and include respectively the first conductive-type first deep well 32A junctioned with the second conductive-type second deep well 33A and the first conductive-type first deep well 32B junctioned with the second conductive-type second deep well 33B. The gate electrode 41 of the first transistor extends over portions of both the first conductive-type first deep well 32A and the second conductive-type second deep well 33A while the gate electrode 41 of the second transistor extends over portions of both the first conductive-type first deep well 32B and the second conductive-type second deep well 33B. The gate insulation layers 40A and 40B are interposed between the gate electrode 41 and the substrate 31. The second conductive-type source regions 37 are formed respectively over the first conductive-type first deep wells 32A and 32B on one side of the respective gate electrode 41 so as to be arrayed at one end portion of the gate electrode 41. The first conductive-type pickup regions 38 are formed over the respective first conductive-type first deep wells 32A and 32B so as to be spaced apart from the second conductive-type source region 37 by a predetermined distance. The first conductive-type first impurity regions 39A and 39B are formed over the first conductive-type first deep wells 32A and 32B to surround the first conductive-type pickup region 38. The second conductive-type drain regions 35 are formed respectively over the second conductive-type second deep wells 33A and 33B on the side of the respective gate electrode 41 opposite the second conductive-type source regions 37 to be spaced apart from the gate electrode 41. The second conductive-type second impurity regions 36 are formed respectively over the second conductive-type second deep wells 33A and 33B to surround the respective second conductive-type drain region 35.

The first conductive-type first impurity regions 39A and 39B improve the contact characteristics between the first conductive-type pickup region 38 and the first conductive-type first deep wells 32A and 32B, respectively. To that end, the first conductive-type first impurity regions 39A and 39B may each have an impurity doping concentration that is higher than that in the first conductive-type first deep wells 32A and 32B and lower than the impurity doping concentration in the first conductive-type pickup region 38. The second conductive-type second impurity region 36 may serve as an expanded second conductive-type drain region 35 to improve the stability of the second conductive-type drain region 35 between operations. The second conductive-type second impurity region 36 may have an impurity doping concentration, which is higher than the impurity doping concentration in the second conductive-type second deep wells 33A and 33B, and which is lower than the impurity doping concentration in the second conductive-type drain region 35. The device isolation layer 42 may be formed through a shallow trench isolation (STI) process. The device isolation layer 42 between the gate electrode 41 and the second conductive-type drain region 35 may partially overlap with the gate electrode 41.

When the gate insulation layer 40A of the first transistor and the gate insulation layer 40B of the second transistor having a lower operation voltage than the first transistor are formed simultaneously during the fabrication of the semiconductor device for controlling power to thereby simplify the fabrication process, the gate insulation layers 40A and 40B formed in the first and second regions respectively have substantially the same thickness (i.e., T1=T2). Therefore, to ensure a sufficient breakdown voltage for the first EDMOS transistor formed in the first region, the impurity doping concentrations of the first conductive-type first deep well 32A and the second conductive-type second deep well 33A of the first region need to be lower than the impurity doping concentrations of the first conductive-type first deep well 32B and the second conductive-type second deep well 33B of the second region.

However, when the impurity doping concentrations of the first conductive-type first deep well 32A and the second conductive-type second deep well 33A of the first region are lowered in a conventional semiconductor device for controlling power in order to secure the breakdown voltage characteristics of the first transistor, the threshold voltage value of the EDMOS transistor formed in the first region may also be lowered below the desired threshold voltage level due to the low impurity doping concentrations in the first conductive-type first deep well 32A and the second conductive-type second deep well 33A.

According to an embodiment of the present disclosure, an overlap region O may be provided by extending (or expanding) the first conductive-type first impurity region 39A of the first region in the direction of the channel length (i.e., the X-X' direction shown in FIG. 2B) so that the first conductive-type first impurity region 39A partially overlaps with the gate electrode 41 to thereby locally increase the impurity doping concentration of the channel region C. With the provision of such overlap region O, it is possible to compensate for the decrease in the threshold voltage caused by a decrease in the impurity doping concentrations of the first conductive-type first deep well 32A and the second conductive-type second deep well 33A formed in the first region. In other words, although the impurity doping concentration may be decreased to secure the breakdown voltage characteristics of the first conductive-type first deep well 32A and the second conductive-type second deep well 33A formed in the first region, the first conductive-type first impurity region 39A may be expanded to secure the desired threshold voltage characteristics through the overlap region O with the gate electrode 41.

Since the first conductive-type first impurity region 39A has a higher impurity doping concentration than the first conductive-type first deep well 32A and the second conductive-type second deep well 33A, and since the first conductive-type first impurity region 39A has a higher impurity doping concentration than the first conductive-type first deep well 32A having the same conductive type, the threshold voltage of the semiconductor device may be increased through the overlap region O. The threshold voltage level can be adjusted by the appropriate selection of the line width (or area) of the overlap region O. That is, the threshold voltage level can be increased by increasing the line width (or area) of the overlap region O.

According to an embodiment, the overlap region O may be formed to span a portion of or the entirety of the channel region C, that is, it may be positioned within the range from the second conductive-type source region 37 to the interface between the first conductive-type first deep well 32A and the second conductive-type second deep well 33A. According to an embodiment, the line width (or area) of the overlap region O may be increased gradually in the direction from the second conductive-type source region 37 toward the second conductive-type drain region 35.

According to an embodiment, the impurity doping concentration of the first conductive-type first impurity region 39A within the overlap region O may have a uniform distribution over the region or may have a variable distribution, for example linearly with a slope. When the impurity doping concentration of the first conductive-type first impurity region 39A within the overlap region O has a slope, according to an embodiment, the impurity doping concentration of the first conductive-type first impurity region 39A within the overlap region O may decrease in the direction from the second conductive-type source region 37 toward the second conductive-type drain region 35.

As described above, the semiconductor device for controlling power according to the an embodiment of the present disclosure has the structure that may include a plurality of transistors having different design and/or fabrication factors, such as the impurity doping concentrations of the active regions 34A and 34B, the thickness of the gate insulation layers 40A and 40B and the like, integrated into the semiconductor device, which is capable of securing the threshold voltage characteristics desired for the transistors, while maintaining the breakdown voltage characteristics, through the overlap region O. Further, the semiconductor device for controlling power according to an embodiment of the present disclosure allows the semiconductor device to be fabricated with a simple fabrication process, at low production cost and with a short production time through mask and ion implantation processes in comparison with a conventional known method for securing the threshold voltage characteristics.

With the gradual increase in the line width (or area) of the overlap region O in the direction from the second conductive-type source region 37 toward the second conductive-type drain region 35 in satisfying the desired threshold voltage characteristics requirement, the deterioration of the breakdown voltage characteristics from the increased threshold voltage may be prevented. When the impurity doping concentration of the first conductive-type first impurity region 39A within the overlap region O has a slope according to an embodiment, deterioration of the breakdown voltage characteristic may be prevented more effectively. That is, since the impurity doping concentration of the channel region C adjacent the drift region, that is, the interface between the first conductive-type first deep well 32A and the second conductive-type second deep well 33A below the gate electrode 41, can still be made relatively low, although the threshold voltage level is increased through the overlap region O, it is possible to prevent the breakdown voltage characteristics from deteriorating. The respective interface between the first conductive-type first deep wells 32A and 32B and the second conductive-type second deep wells 33A and 33B under the gate electrode 41, that is, the area ranging from the point where the channel region C ends to the second conductive-type drain region 35 is generally referred to as a drift region.

Also, since the impurity doping concentration on the surface of the substrate 31 of the channel region C adjacent the drift region may be lower than the impurity doping concentration resulting from conventional methods for securing the threshold voltage characteristics through mask and ion implantation processes, the surface mobility of carriers may be improved, and as a result, the operating current may advantageously be increased.

According to another embodiment of the present disclosure, a semiconductor device for controlling power may have the same impurity doping concentration in the active regions, and may be of a structure where a plurality of transistors of different gate insulation layer thickness are integrated in one substrate, and may be capable of securing the desired threshold voltage characteristics for each transistor while maintaining sufficient breakdown voltage characteristics.

Figure 3A:
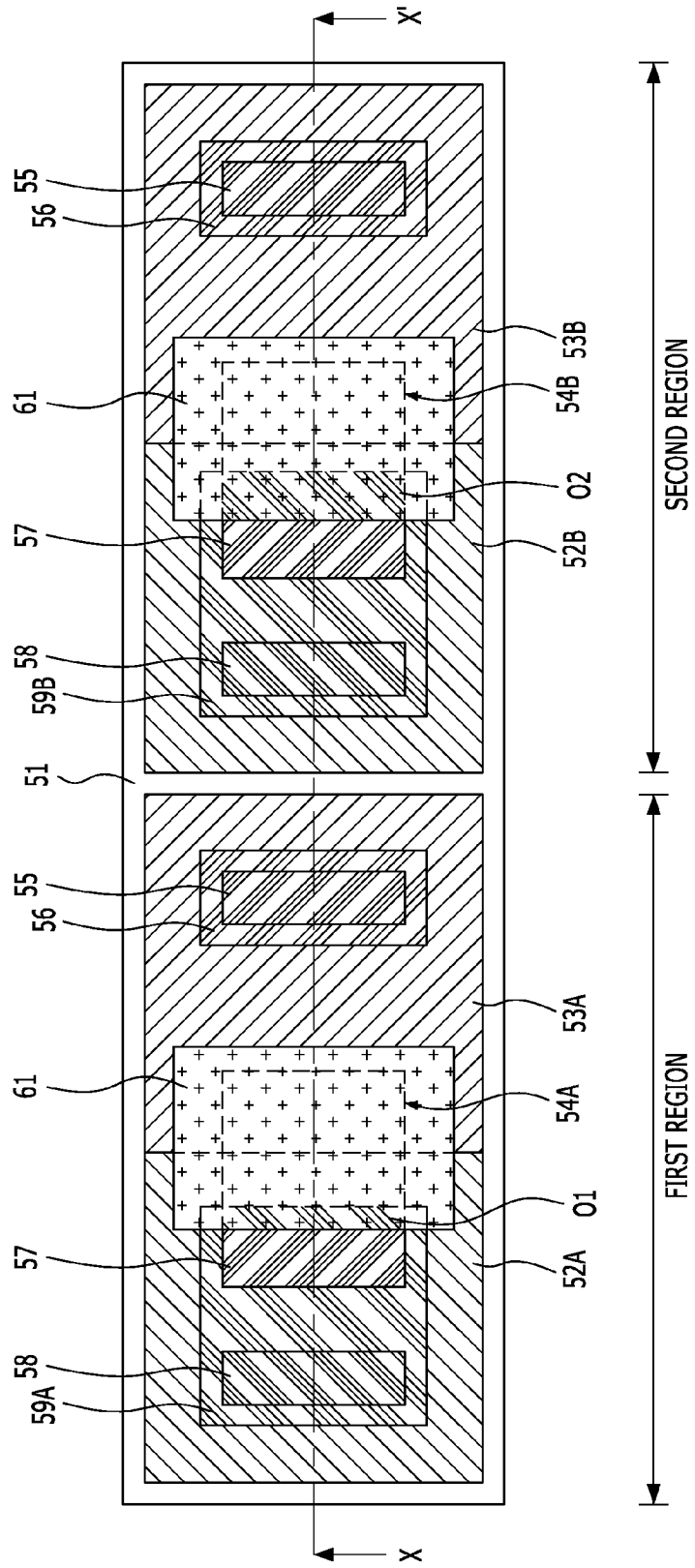

FIGS. 3A and 3B illustrate a semiconductor device for controlling power in accordance with another embodiment of the present disclosure. FIG. 3A is a plan view of the semiconductor device for controlling power. FIG. 3B is a cross-sectional view of the semiconductor device for controlling power of FIG. 3A taken along the line X-X'.

Referring to FIGS. 3A and 3B, the semiconductor device for controlling power according to an embodiment of the present disclosure may include EDMOS transistors formed respectively in the first and second regions of a substrate 51. For the sake of convenience, in the following description, the transistor formed in the first region will be referred to as the first transistor while the transistor formed in the second region will be referred to as the second transistor. Further, it is assumed in this example that the first and second transistors formed in the first and second regions, respectively, required certain desired breakdown voltage characteristics, and that their respective threshold voltage characteristics are the same.

The first and second transistors each include corresponding ones of the first conductive-type first deep wells 52A and 52B and second conductive-type second deep wells 53A and 53B formed over a substrate 51, corresponding one of active regions 54A and 54B, a gate electrode 61, corresponding gate insulation layers 60A or 60B, a second conductive-type source region 57, a first conductive-type pickup region 58, the corresponding first conductive-type first impurity regions 59A and 59B, a second conductive-type drain region 55 and a second conductive-type second impurity region 56, as shown in FIGS. 3A and 3B.

The active regions 54A and 54B are defined by a device isolation layer 62 formed over the substrate 51, and have the structure where the first conductive-type first deep wells 52A and 52B and the second conductive-type second deep wells 53A and 53B respectively are junctioned. The gate electrode 61 of the first transistor may extend at least partially over both the first conductive-type first deep well 52A and the second conductive-type second deep well 53A. The gate electrode 61 of the second transistor may extend at least partially over both the first conductive-type first deep well 52B and the second conductive-type second deep well 53B. The gate insulation layers 60A and 60B are interposed between the gate electrode 61 and the substrate 51. The second conductive-type source regions 57 are formed respectively over the first conductive-type first deep wells 52A and 52B to be arrayed at one end of one side of the respective gate electrode 61. The first conductive-type pickup regions 58 are formed respectively over the first conductive-type first deep wells 52A and 52B to be spaced apart from the respective second conductive-type source region 57 by a predetermined distance. The first conductive-type first impurity regions 59A and 59B are formed over the first conductive-type first deep wells 52A and 52B to surround the first conductive-type pickup region 58 while overlapping a portion of the respective gate electrode 61. The second conductive-type drain regions 55 are formed respectively over the second conductive-type second deep wells 53A and 53B to be spaced apart from the gate electrode 61. The second conductive-type second impurity regions 56 are formed respectively over the second conductive-type second deep wells 53A and 53B to surround the respective second conductive-type drain region 55.

The first conductive-type first impurity regions 59A and 59B may serve to improve the contact characteristics between the first conductive-type first deep well 52A and the first conductive-type pickup region 58, and between the first conductive-type first deep well 52B and the first conductive-type pickup region 58, respectively. The first conductive-type first impurity regions 59A and 59B may have a higher impurity doping concentration than the first conductive-type first deep wells 52A and 52B, and may have a lower impurity doping concentration than the first conductive-type pickup region 58. The second conductive-type second impurity region 56 may serve as an expanded second conductive-type drain region 55 to improve the stability of the second conductive-type drain region 55 between operations. The second conductive-type second impurity region 56 may have a higher impurity doping concentration than the second conductive-type second deep wells 53A and 53B, and may have a lower impurity doping concentration than the second conductive-type drain region 55. The device isolation layer 62 may be formed through a shallow trench isolation (STI) process. The portion of the device isolation layer 62 between the gate electrode 61 and the second conductive-type drain region 55 may partially overlap the lower portion of the gate electrode 61.

The semiconductor device for controlling power fabricated according to an embodiment of the present disclosure having the above-described structure may have the same impurity doping concentration in the active regions 54A and 54B formed in the first and second regions, respectively. However, since the semiconductor device for power control includes the gate insulation layers 60A and 60B formed in the first and second regions respectively in different thicknesses (T1≠T2), the threshold voltage level of the first transistor and the threshold voltage level of the second transistor may be different from each other. For example, when the gate insulation layer 60A of the first transistor is thicker than the gate insulation layer 60B of the second transistor (T1>T2), the threshold voltage of the first transistor is greater than the threshold voltage of the second transistor, that is, the threshold voltage level is directly proportional to the thickness of the gate insulation layer. Therefore, it may be necessary to implant different amounts of ions as an impurity into the respective channel regions C of the first and second transistors through additional mask and ion implantation processes in order to make the threshold voltage levels of the first and second transistors to be the same.

According to an embodiment of the present disclosure, overlap regions O1 and O2 may be formed by expanding the first conductive-type first impurity regions 59A and 59B formed respectively in the first and second regions in the direction of the channel length in such a manner the first conductive-type first impurity regions 59A and 59B are overlapped at least partially with the respective gate electrode 61 to thereby realize the desired threshold voltage characteristics of the semiconductor device by controlling the line width(s) (or area(s)) of the overlap regions O1 and O2 to locally adjust the respective impurity doping concentrations of the channel regions C. In other words, although the first and second transistors have the gate insulation layers 60A and 60B of different thicknesses, by expanding the first conductive-type first impurity regions 59A and 59B according to an embodiment of the present disclosure described herein, it is possible to make the first and second transistor to have the same threshold voltage through the overlap regions O1 and O2.

Since the first conductive-type first impurity regions 59A and 59B have a higher impurity doping concentration than the first conductive-type first deep wells 52A and 52B and the second conductive-type second deep wells 53A and 53B, the threshold voltage of the semiconductor device may be adjusted by adjusting the line width (or area) of the overlap region(s) O1 and/or O2. Therefore, it is possible to make the first and second transistors having different gate insulation thicknesses to have the same threshold voltage value by forming the line width (or area) of the overlap region O2 of the second transistor, which has a relatively thinner thickness T2, wider than the line width (or area) of the overlap region O1 of the first transistor.

The overlap regions O1 and O2 may be formed to be positioned within the channel regions C, that is, to be positioned within the range from the second conductive-type source region 57 to the interface between the first conductive-type first deep wells 52A and 52B and the second conductive-type second deep wells 53A and 53B. According to an embodiment, the line width(s) (or area(s)) of the overlap regions O1 and O2 may be made to increase gradually along the direction from the second conductive-type source region 57 toward the second conductive-type drain region 55.

The impurity doping concentrations of the first conductive-type first impurity regions 59A and 59B within the overlap regions O1 and O2 may have a predetermined fixed value or may be variable with a slope. When the impurity doping concentration of the first conductive-type first impurity regions 59A and 59B within the overlap regions O1 and O2 has a slope according to an embodiment, the impurity doping concentration of the first conductive-type first impurity regions 59A and 59B within the overlap regions O1 and O2 may be decreased in the direction from the second conductive-type source region 57 toward the second conductive-type drain region 55.

As described above, the semiconductor device for controlling power according to an embodiment of the present disclosure may have the structure that includes a plurality of integrated transistors having different fabrication factors, such as the impurity doping concentration of the active regions MA and MB, the thickness of the gate insulation layers 60A and 60B and the like, and may be capable of securing the desired threshold voltage characteristics for the transistors while maintaining the breakdown voltage characteristics through the provision of the overlap regions O1 and O2. Further, the semiconductor device for controlling power according to an embodiment of the present disclosure may be fabricated through a simple, low cost and faster fabrication processes when compared with conventional approaches in securing the threshold voltage characteristics.

By gradual increase in the line width (or area) of the overlap regions O1 and/or O2 along the direction from the second conductive-type source region 57 toward the second conductive-type drain region 55, the threshold voltage may be increased to meet the desired threshold voltage characteristics while still avoiding the possible deterioration of the breakdown voltage characteristics from the increase in the threshold voltage level. When the impurity doping concentrations of the first conductive-type first impurity regions 59A and 59B within the overlap regions O1 and O2 are made to vary with a slope, deterioration in the breakdown voltage characteristics may be prevented more effectively.

As the impurity doping concentration on the surface of the substrate 51 of the channel region C adjacent the drift region may be made lower than the impurity doping concentration resulting from conventional methods of securing the threshold voltage characteristics through mask and ion implantation processes, it may also be possible to realize an improvement in the surface mobility of carriers, and, as a result, the operating current of the semiconductor device may advantageously be increased.

Another embodiment of the present disclosure provides a semiconductor device for controlling power that includes transistors, of which the gate insulation layers thereof are of the same thickness, but the active regions of which have different respective impurity doping concentrations, integrated in one substrate, and that is capable of preventing an adverse impact on the operational characteristics by a hump effect, which may occur as a result of a localized decrease along the direction of the channel width in the impurity doping concentration of the channel region adjacent the device isolation layer, while still securing the desired threshold voltage characteristics of the transistors. Localized variations in the impurity doping concentration over the width of the channel may occur, for example, when during the doping of a P-type deep well that is located underneath a gate electrode with impurity, e.g., boron, an adjacent device isolation layer may become impregnated with the impurity along the direction of the channel width, and, as a result, the doping concentration in localized portions of the channel region adjacent the device isolation layer may decrease.

Figure 4A:
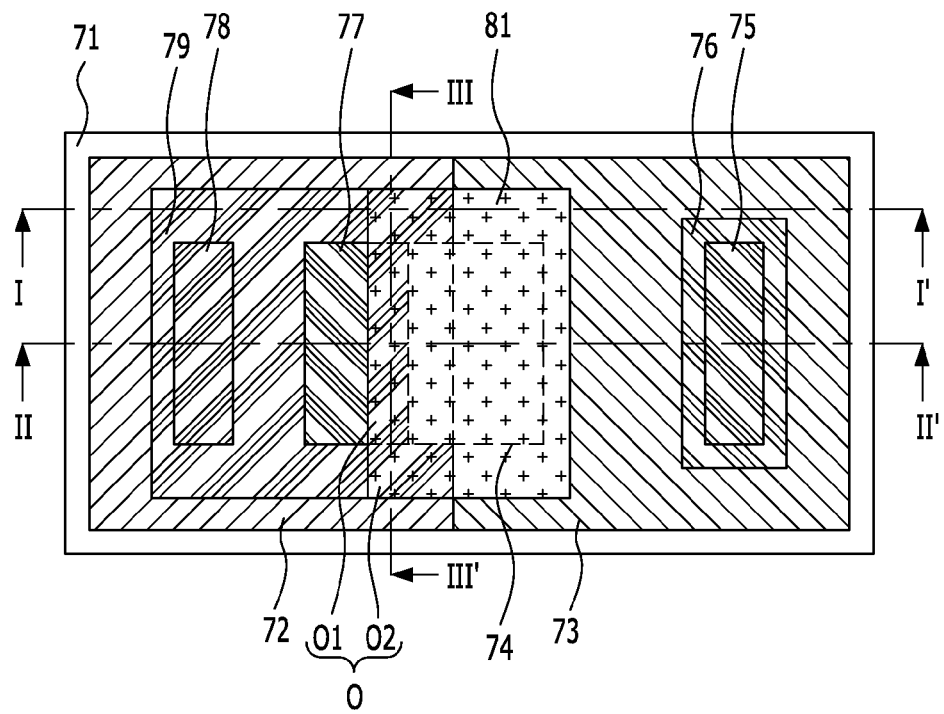
FIGS. 4A to 4D are diagrams illustrating a semiconductor device for controlling power in accordance with another embodiment of the present disclosure.
Figure 4B:
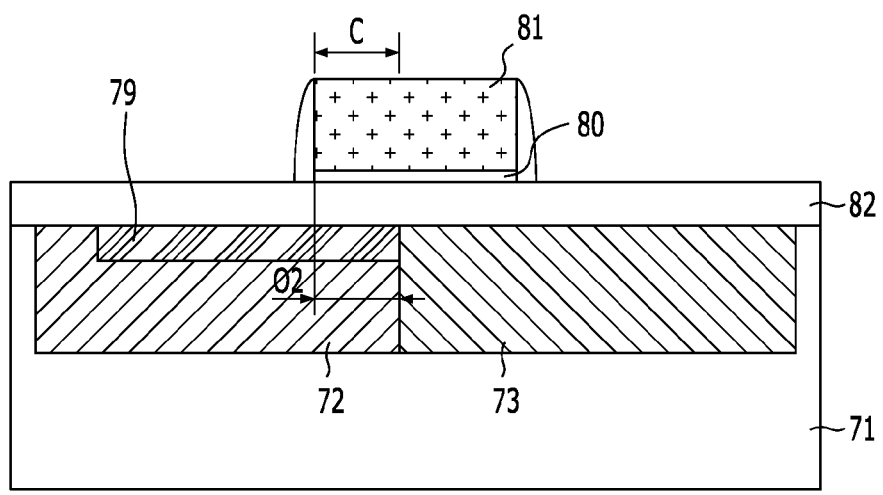
Figure 4C:
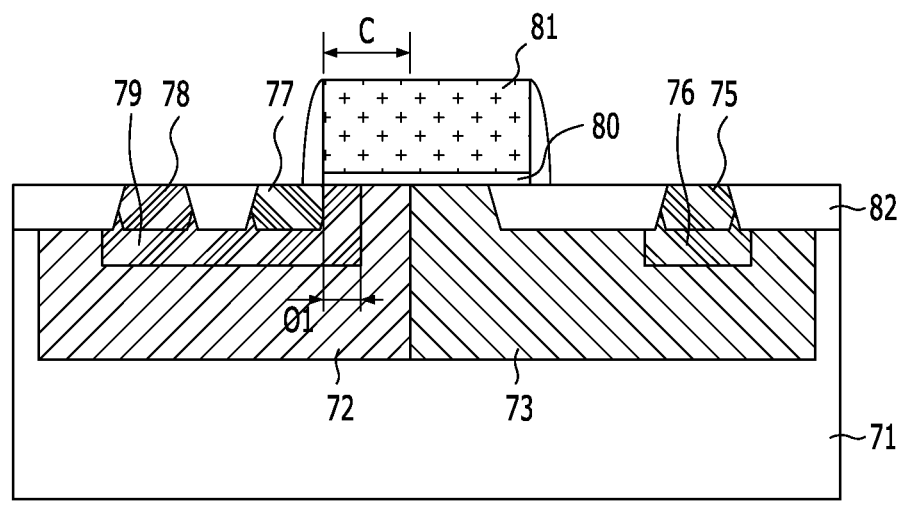
Figure 4D:
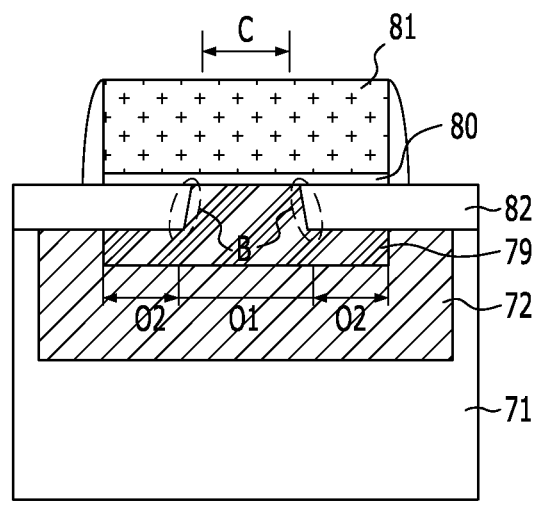

FIGS. 4A and 4B illustrate a semiconductor device for controlling power in accordance with an embodiment of the present disclosure. FIG. 4A is a plan view of the semiconductor device for controlling power. FIG. 4B is a cross-sectional view of the semiconductor device of FIG. 4A taken along the line I-I'. FIG. 4C is a cross-sectional view of the semiconductor device of FIG. 4A taken along the line II-II'. FIG. 4D is a cross-sectional view of the semiconductor device of FIG. 4A taken along the line III-III'.

Referring to FIGS. 4A to 4D, the semiconductor device for controlling power according to an embodiment of the present disclosure may include a first conductive-type first deep well 72 and a second conductive-type second deep well 73 formed over a substrate 71, an active region 74, a gate electrode 81, a gate insulation layer 80, a second conductive-type source region 77, a first conductive-type pickup region 78, a first conductive-type first impurity region 79, a second conductive-type drain region 75 and a second conductive-type second impurity region 76.

The active region 74 is defined by a device isolation layer 82 formed over the substrate 71, and may have the structure that includes the first conductive-type first deep well 72 and the second conductive-type second deep well 73 that are junctioned. The gate electrode 81 crosses or extends over portions of both the first conductive-type first deep well 72 and the second conductive-type second deep well 73. The gate insulation layer 80 is interposed between the gate electrode 81 and the substrate 71. The second conductive-type source region 77 is formed over the first conductive-type first deep well 72 to be arrayed at one end of one side of the gate electrode 81. The first conductive-type pickup region 78 is formed over the first conductive-type first deep well 72 to be spaced apart from the second conductive-type source region 77 by a predetermined distance. The first conductive-type first impurity region 79 is formed over the first conductive-type first deep well 72 to surround the first conductive-type pickup region 78. The second conductive-type drain region 75 is formed over the second conductive-type second deep well 73 to be spaced apart from one end of another side of the gate electrode 81. The second conductive-type second impurity region 76 is formed over the second conductive-type second deep well 73 to surround the second conductive-type drain region 75.

The first conductive-type first impurity region 79 may serve to improve the contact characteristics between the first conductive-type first deep well 72 and the first conductive-type pickup region 78. The first conductive-type first impurity region 79 may have a higher impurity doping concentration than the first conductive-type first deep well 72, and may have a lower impurity doping concentration than the first conductive-type pickup region 78. The second conductive-type second impurity region 76 may serve as an expanded second conductive-type drain region 75 to improve the stability of the second conductive-type drain region 75 between operations. The second conductive-type second impurity region 76 may have a higher impurity doping concentration than the second conductive-type second deep well 73, and may have a lower impurity doping concentration than the second conductive-type drain region 75. The device isolation layer 82 may be formed through a shallow trench isolation (STI) process. The device isolation layer 82 between the gate electrode 81 and the second conductive-type drain region 75 may partially overlap with the lower portion of the gate electrode 81.

In the semiconductor device fabricated according to an embodiment of the present disclosure having the above-described structure, an overlap region O may be formed by extending (or expanding) the first conductive-type first impurity region 79 so that the first conductive-type first impurity region 79 overlaps with the gate electrode 81. The overlap region O may include a first overlap region O1 and a second overlap region O2. The first overlap region O1 is the region where the gate electrode 81 is overlapped with the first conductive-type first impurity region 79 within the active region 74 in order to secure suitability of the threshold voltage characteristics as well as of the breakdown voltage characteristics. The second overlap region O2 is a region where the gate electrode 81 is overlapped with the first conductive-type first impurity region 79 within an inactive region, that is, outside the active region 74, in order to prevent deterioration in the operational characteristics due to a localized decrease (along the channel width direction, which is the III-III' direction shown in FIG. 4A) in the impurity doping concentration in the channel region C in portions near the device isolation layer 82.

For securing suitable threshold voltage and breakdown voltage characteristics, the semiconductor device of the above-described structure according to an embodiment of the present disclosure is capable of increase the impurity doping concentration locally of the channel region C by including the first overlap region O1, the line width (or area) of which may be controlled.

That is, as the impurity doping concentration of the active region 74, that is, the impurity doping concentrations of the first conductive-type first deep well 72 and the second conductive-type second deep well 73, is decreased, or the thickness of the gate insulation layer 80 decreases, the threshold voltage level of the semiconductor device also decreases. However, since the first conductive-type first impurity region 79 has a higher impurity doping concentration than the first conductive-type first deep well 72 and the second conductive-type second deep well 73, the level of the threshold voltage may be increased by increasing the line width (or area) of the first overlap region O1. Therefore, it is possible to secure the threshold voltage characteristics as well as the breakdown voltage characteristics desired for the transistor through the provision of the first overlap region O1.

The first overlap region O1 may be formed to be positioned within the channel region C, that is, to be within the range from the second conductive-type source region 77 to the interface between the first conductive-type first deep well 72 and the second conductive-type second deep well 73. According to an embodiment, the line width (or area) of the first overlap region O1 may be made to increase gradually along the direction from the second conductive-type source region 77 toward the second conductive-type drain region 75.

In addition, the impurity doping concentration of the first conductive-type first impurity region 79 within the first overlap region O1 may have a predetermined fixed value or may vary to have a slope. When the impurity doping concentration of the first conductive-type first impurity region 79 within the first overlap region O1 has a slope, the impurity doping concentration of the first conductive-type first impurity region 79 within the overlap region O may be made to decrease along the direction from the second conductive-type source region 77 toward the second conductive-type drain region 75.

As described above, the semiconductor device for controlling power according to an embodiment of the present disclosure includes the first overlap region O1, and may thus be fabricated through a simple, low cost, and/or faster fabrication processes. It may also be possible to prevent deterioration in the breakdown voltage characteristics from the increase in the threshold voltage level, and to increase the operating current resulting from the improved surface mobility of carriers.

For the purposes of preventing the deterioration in the operational characteristics due to the localized channel widthwise decrease in the impurity doping concentration in the channel region C adjacent the device isolation layer 82, the semiconductor device for controlling power according to an embodiment of the present disclosure includes the second overlap region O2 having the structure that the gate electrode 81 and the first conductive-type first impurity region 79 are overlapped over a substrate 71 of an inactive region, i.e., a region outside the active region 74. The inactive region may correspond to a region or regions where the device isolation layer 82 is formed over the substrate 71, and may include those regions of the first conductive-type first deep well 72 and the second conductive-type second deep well 73 that are covered by or that overlap the device isolation layer 82.

As illustrated in FIG. 4D, when doping the first conductive-type first deep well 72 with impurity, due to the interference by the device isolation layer 82, the resulting impurity doping concentration of the channel region C in those localized portions vicinal to the device isolation layer 82 (indicated as 'B' in FIG. 4D) may be lower than that in the other portions of the channel According to an embodiment of the present disclosure, the second overlap region O2 may be formed over the substrate 71 and in the inactive region, which is a region or regions other than the active region 74, at the position under the gate electrode 81 and outside of the channel region C near the portions experiencing the localized decrease in the impurity doping concentration so as to compensate for the impurity doping concentration reduction in the portions of the channel region C adjacent the device isolation layer 82. With the provision of the second overlap region O2 according to an embodiment of the present disclosure, it is possible to reduce the adverse impact of the hump effect on the operational characteristics of the semiconductor device. In order to effectively compensate for the localized reduction in the impurity doping concentration in the channel region C, the line width of the second overlap region O2 may be made wider than the line width of the first overlap region O1 in the direction of channel length, which is the I-I' direction shown in FIG. 4A. Further, according to an embodiment, the second overlap region O2 may be formed to have the same line width (or area) as the region of overlap between the gate electrode 81 of the inactive region and the first conductive-type first deep well 72.

Figure 5A:
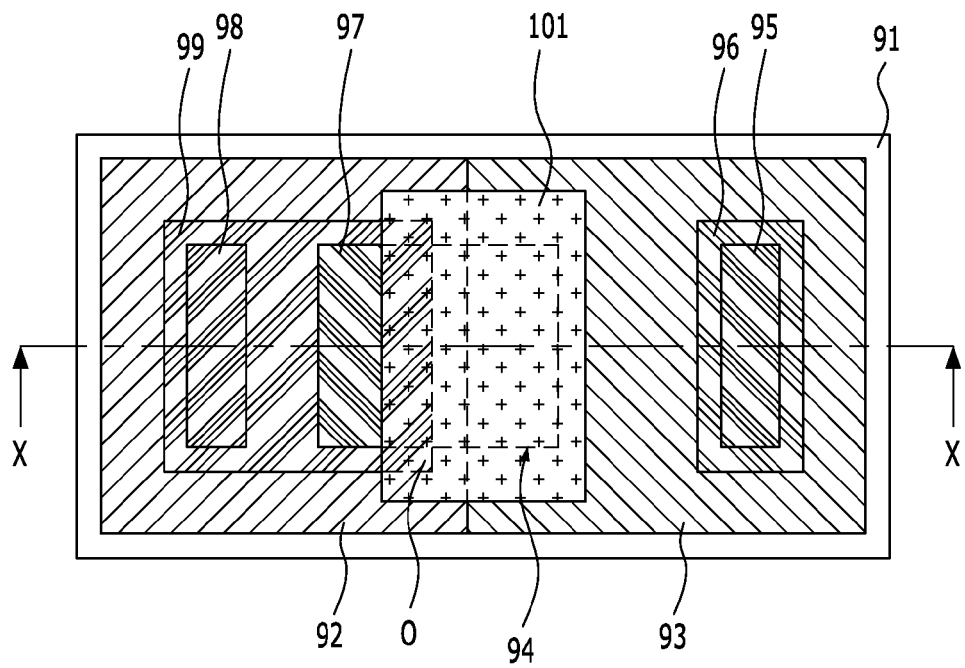
FIGS. 5A and 5B are diagrams illustrating a semiconductor device for controlling power in accordance with another embodiment of the present disclosure.
Figure 5B:
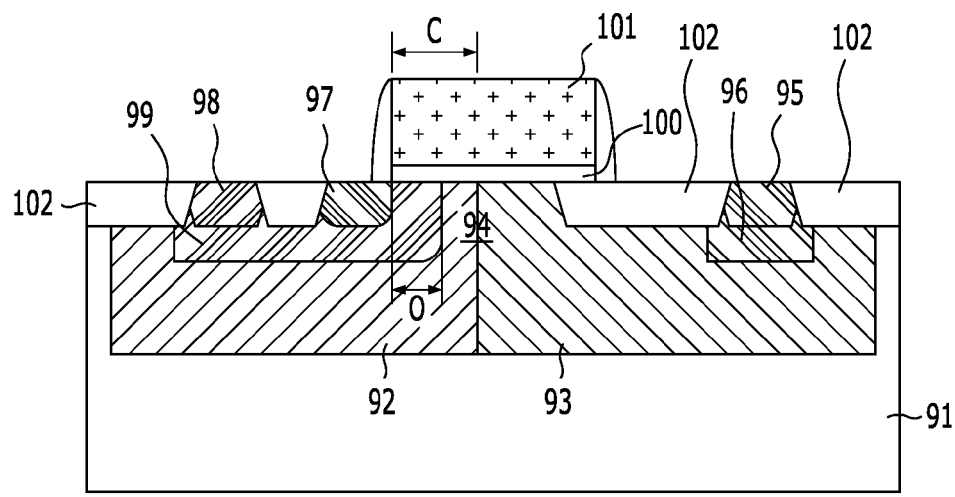

FIGS. 5A and 5B illustrate a semiconductor device fabricated according to another embodiment of the present disclosure. FIG. 5A is a plan view of the semiconductor device, and FIG. 5B is a cross-sectional view of the semiconductor device of FIG. 5A taken along the cutting line X-X'.

Referring to FIGS. 5A and 5B, the semiconductor device includes EDMOS transistor provided with a first conductive-type first deep well 92 and a second conductive-type second deep well 93 formed over a substrate 91, an active region 94, a gate electrode 101, a gate insulation layer 100, a second conductive-type source region 97, a first conductive-type pickup region 98, a first conductive-type first impurity region 99, a second conductive-type drain region 95, and a second conductive-type second impurity region 96.

The active region 94 is defined by a device isolation layer 92 formed over the substrate 91 and has a structure where the first conductive-type first deep well 92 is junctioned with the second conductive-type second deep well 93. The gate electrode 101 crosses both the first conductive-type first deep well 92 and the second conductive-type second deep well 93 over the substrate 91. The gate insulation layer 100 is interposed between the substrate 91 and the gate electrode 101. The second conductive-type source region 97 is formed over the first conductive-type first deep well 92 to be arrayed at one end of one side of the gate electrode 101. The first conductive-type pickup region 98 is formed over the first conductive-type first deep well 92 to be spaced apart from the second conductive-type source region 97 by a predetermined distance. The first conductive-type first impurity region 99 is formed over the first conductive-type first deep well 92 to surround the first conductive-type pickup region 98. An overlap region O is provided corresponding to a portion of the first conductive-type first impurity region 99 being overlapped with a portion of the gate electrode 101. The second conductive-type drain region 95 is formed over the second conductive-type second deep well 93 by being spaced apart from one end of the other side of the gate electrode 101 by a predetermined distance. The second conductive-type second impurity region 96 is formed over the second conductive-type second deep well 93 to surround the second conductive-type drain region 95.

The first conductive-type first impurity region 99 improves a contact characteristic between the first conductive-type first deep well 92 and the first conductive-type pickup region 98 while controlling a threshold voltage. The first conductive-type first impurity region 99 may have a higher impurity doping concentration than the first conductive-type first deep well 92 and a lower impurity doping concentration than the first conductive-type pickup region 98. The second conductive-type second impurity region 96 functions as an extended drain region 95 to thereby improve stability of the second conductive-type drain region 95 during an operation. The second conductive-type second impurity region 96 may have a higher doping impurity concentration than the second conductive-type second deep well 93 and a lower impurity doping concentration than the second conductive-type drain region 95. The device isolation layer 102 may be formed through a shallow trench isolation (STI) and the device isolation layer 102 between the gate electrode 101 and the second conductive-type drain region 95 may have a partially overlapped structure under the gate electrode 101.

A threshold voltage level of a transistor may go in proportion to the impurity doping concentration of an active region and the thickness of a gate insulation layer. In other words, when any one between the impurity doping concentration of the active region and the thickness of the gate insulation layer is decreased, the threshold voltage level may also decrease. Since the impurity doping concentration of the active region affects the breakdown voltage characteristic of a semiconductor device, it may be difficult to control the impurity doping concentration of the active region in order to secure the threshold voltage characteristic. Also, when a method of controlling the thickness of the gate insulation layer is used for each transistor in order to secure the threshold voltage characteristic, it may warrant a deposition process (or a growing process), a mask process, and an etch process multiple times. This increases the number of procedural steps and may deteriorate the layer quality of the gate insulation layer.

The semiconductor device of FIGS. 5A and 5B described above has the overlap region O between the first conductive-type first impurity region 99 and the gate electrode 101 by extending (or expanding) the first conductive-type first impurity region 99 in the direction of channel length, which is X-X' direction. The formation of the overlap region O locally increases the impurity doping concentration of a channel region C. Accordingly, the desired threshold voltage characteristic of the semiconductor device may be secured without adjusting the impurity doping concentration of the active region 94 and the thickness of the gate insulation layer 100.

For example, because the first conductive-type first impurity region 99 has a higher impurity doping concentration than the active region 94, in particular, the first conductive-type first deep well 92 which has the same conductive type as the first conductive-type first impurity region 99, the threshold voltage level of the semiconductor device can be increased through the overlap region O and as the line width (or area) of the overlap region O is increased, the level of the threshold voltage is also raised.

The overlap region O may be formed to be positioned within the channel region C, that is, within a range from the second conductive-type source region 97 to the interface between the first conductive-type first deep well 92 and the second conductive-type second deep well 93. When the line width (or area) of the overlap region O is increased, it may be gradually increased it in a direction from the second conductive-type source region 97 toward the second conductive-type drain region 95 based on a desired threshold voltage characteristic.

Also, the impurity doping concentration of the first conductive-type first impurity region 99 within the overlap region O may have a uniform value, or a slope. When the impurity doping concentration of the first conductive-type first impurity region 99 within the overlap region O has a slope, it may be gradually decreased in the direction from the second conductive-type source region 97 toward the second conductive-type drain region 95 based on a desired threshold voltage characteristic.

By utilizing the overlap region O, the fabrication process can be simplified and the production cost reduced compared with a conventional method of securing the threshold voltage characteristic by forming a threshold voltage control layer through a mask process and an ion implantation process. Also, since the line width (or area) of the overlap region O may be gradually increased in the direction from the second conductive-type source region 97 toward the second conductive-type drain region 95 according to the desired threshold voltage characteristic, the threshold voltage level can be increased through the overlap region O and accordingly, prevent the breakdown voltage characteristic from being deteriorated. Moreover, when the impurity doping concentration of the first conductive-type first impurity region 99 within the overlap region O is formed to have a slope, the breakdown voltage characteristic may be prevented from being deteriorated.

For example, since the impurity doping concentration of the channel region C adjacent to a drift region, that is, the impurity doping concentration of the active region 94 adjacent to the interface between the first conductive-type first deep well 92 and the second conductive-type second deep well 93 under the gate electrode 101 can be maintained low, deterioration of the breakdown voltage characteristic may be prevented although the threshold voltage level is increased through the overlap region O. The drift region is generally referred to an area ranging from the interface between the first conductive-type first deep well 92 and the second conductive-type second deep well 93 under the gate electrode 101, that is, a point where the channel region C ends, to the second conductive-type drain region 95.

Also, since the impurity doping concentration on the surface of the substrate 91 of the channel region C adjacent to the drift region can be brought relatively low, compared with a conventional method of securing the threshold voltage characteristic by forming a threshold voltage control layer through a mask process and an ion implantation process, the surface mobility of carriers may be improved, and as a result, the operating current may be increased.

Hereafter, examples of a method for fabricating a semiconductor device according to the present disclosure will be described.

Figure 6A:
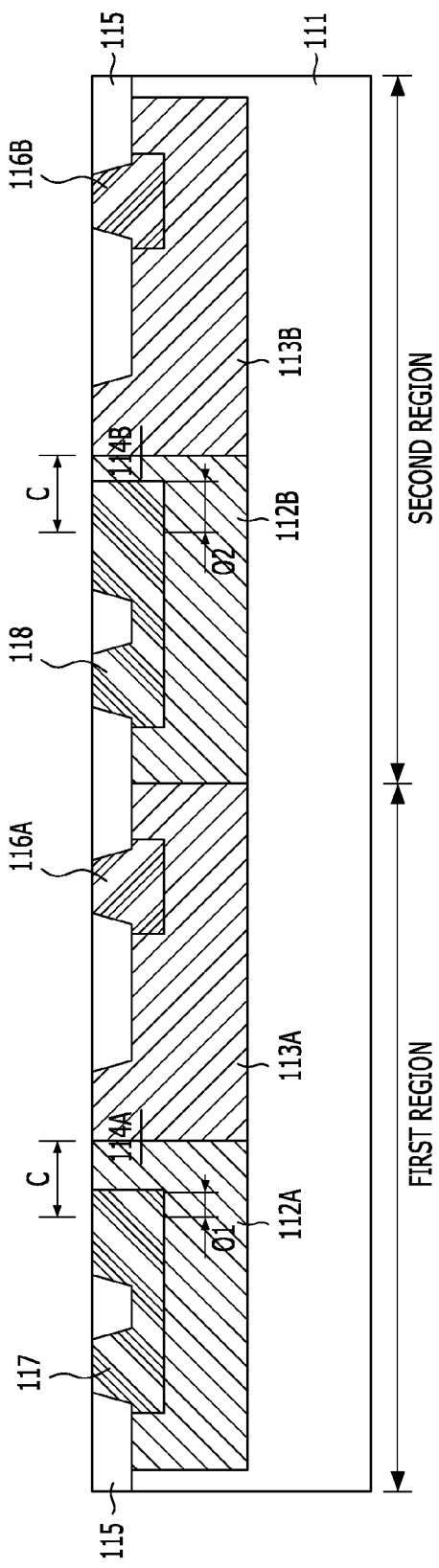
FIGS. 6A to 6C are diagrams illustrating cross-sectional views of a semiconductor device for describing a method for fabricating the semiconductor device in accordance with an embodiment of the present disclosure.
Figure 6B:
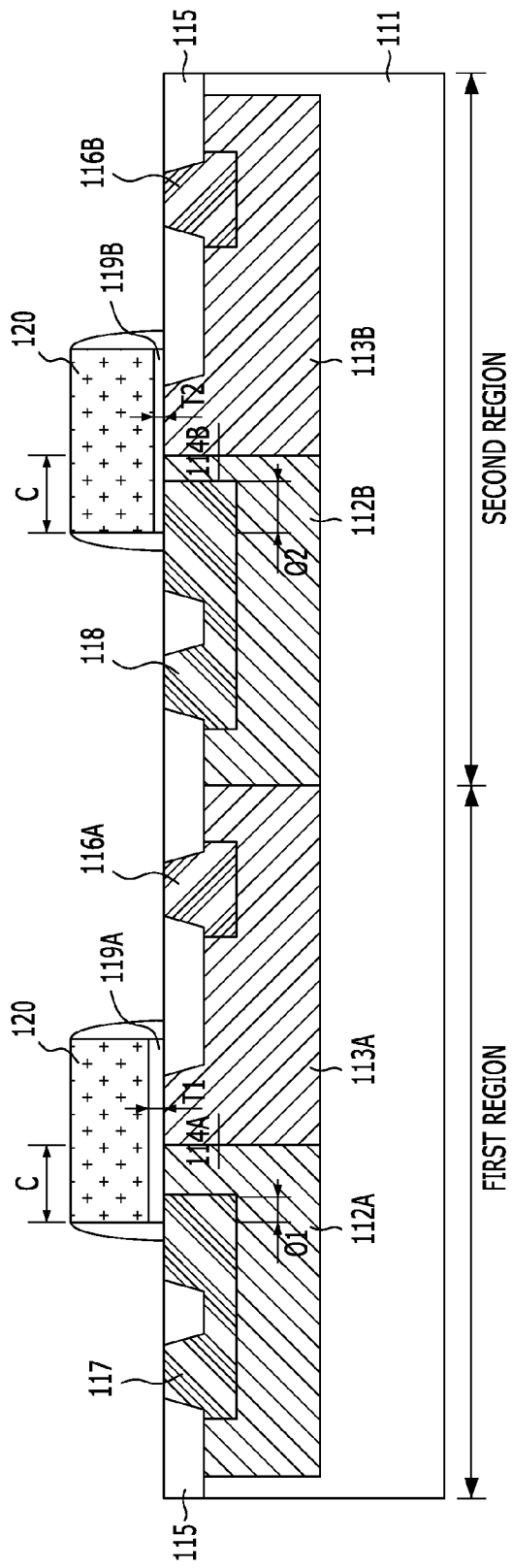
Figure 6C:
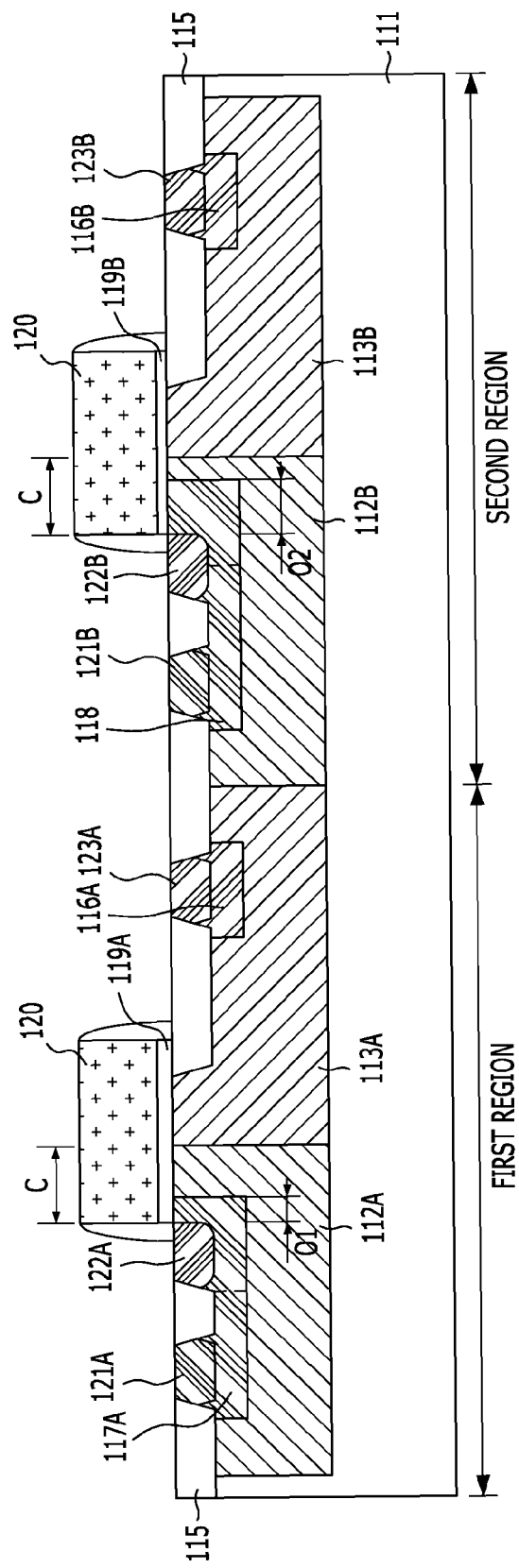

FIGS. 6A to 6C are cross-sectional views illustrating a method for fabricating a semiconductor device in accordance with an embodiment of the present disclosure.

Referring to FIG. 6A, a first conductive-type impurity and a second conductive-type impurity are implanted into a first region and a second region of a substrate 111 through an ion implantation process. Thereafter, first conductive-type first deep wells 112A and 112B and second conductive-type second deep wells 113A and 113B are formed by performing a thermal treatment for activating the implanted impurities.

Thereafter, active regions 114A and 114B having a structure where the first conductive-type first deep wells 112A and 112B are junctioned with the second conductive-type second deep wells 113A and 113B over the substrate 111 are defined and a device isolation layer 115 is formed to be partially overlapped with a region where a gate is to be formed. The device isolation layer 115 may be formed through, for example, a shallow trench isolation (STI) process.

Thereafter, the first conductive-type impurity and the second conductive-type impurity are implanted into a predetermined region of the substrate 111, and first conductive-type first impurity regions 117 and 118 are formed in the first conductive-type first deep wells 112A and 112B and second conductive-type second impurity regions 116A and 116B are formed in the second conductive-type second deep wells 113A and 113B by performing a thermal treatment for activating the implanted impurities. The impurity doping concentration of the first conductive-type first impurity regions 117 and 118 may be higher than the impurity doping concentration of the first conductive-type first deep wells 112A and 112B. Also, the thermal treatment for forming the first conductive-type first impurity regions 117 and 118 and the second conductive-type second impurity regions 116A and 116B is performed at a temperature lower than that of the thermal treatment for forming the first conductive-type first deep wells 112A and 112B and the second conductive-type second deep wells 113A and 113B.

The first conductive-type first impurity regions 117 and 118 are formed by ion-implanting the first conductive-type impurity into the first conductive-type first deep wells 112A and 112B, and the first conductive-type first impurity regions 117 and 118 are extended (or expanded) to a region where a channel region C is to be formed to thereby form overlap regions O1 and O2 where the first conductive-type first impurity regions 117 and 118 are overlapped with the region where the channel region C is to be formed. The threshold voltage characteristic desired for each region may be secured through an ion implantation process and a thermal process that are performed one time by controlling the areas of the overlap regions O1 and O2 formed for corresponding regions.

For example, in a case where the active regions 114A and 114B of the first region and the second region have the same impurity doping concentration; semiconductor devices to be formed in the first region and the second region to have the same threshold voltage level; and a gate insulation layer formed in the first region is thicker than a gate insulation layer to be formed in the second region, the threshold voltage characteristics desired by the semiconductor devices to be formed in the first region and the second region may be acquired by forming the line width (or area) of the overlap region O2 formed in the second region wider than the line width (or area) of the overlap region O1 formed in the first region.

Referring to FIG. 6B, gate insulation layers 119A and 119B are formed over the substrate 111. The thickness T1 of the gate insulation layer 119A formed over the first region of the substrate 111 is greater than the thickness T2 of the gate insulation layer 119B formed over the second region of the substrate 111 (T1>T2).

Thereafter, a gate conductive layer is deposited over the substrate 111. A gate having a structure where the gate insulation layers 119A and 119B and a gate electrode 120 are sequentially stacked is formed to cross both the first conductive-type first deep wells 112A and 112B and the second conductive-type second deep wells 113A and 113B in each region by sequentially etching the gate conductive layer and the gate insulation layers 119A and 119B.

Referring to FIG. 6C, source regions 122A and 122B are formed to be arrayed at one end of one side of the gate electrode 120 by ion-implanting the second conductive-type impurity into the substrate 111, that is, into the first conductive-type first deep wells 112A and 112B. Also, drain regions 123A and 123B are formed to be spaced apart from one end of another side of the gate electrode 120 by a predetermined distance by ion-implanting the second conductive-type impurity into the substrate 111, that is, into the second conductive-type second impurity regions 116A and 116B.

Thereafter, first conductive-type pickup regions 121A and 121B are formed to be spaced apart from the source regions 122A and 122B by a predetermined distance by ion-implanting the first conductive-type impurity into the first conductive-type first impurity regions 117 and 118.

Thereafter, a thermal treatment is performed to activate the impurities implanted into the first conductive-type pickup regions 121A and 121B, the source regions 122A and 122B, and the drain regions 123A and 123B.

According to the method of FIGS. 6A to 6C, the threshold voltage characteristic desired for each transistor may be secured while maintaining the breakdown voltage characteristic by forming the overlap regions O1 and O2 in a semiconductor device for controlling power having a structure where a plurality of transistors having different processing factors, such as the impurity doping concentration of the active regions 114A and 114B, the thickness of the gate insulation layers 119A and 119B and so forth are integrated over one substrate. Also, the threshold voltage characteristic desired for each transistor may be acquired through a one-time ion implantation process performed for each transistor without forming a threshold voltage control layer. Moreover, procedural steps for fabricating a semiconductor device may be simplified while taking the advantage of the operational characteristics mentioned with reference to FIGS. 5A and 5B.

FIGS. 7A to 7D are cross-sectional views illustrating a method for fabricating a semiconductor device in accordance with another embodiment of the present disclosure.

Figure 7A:
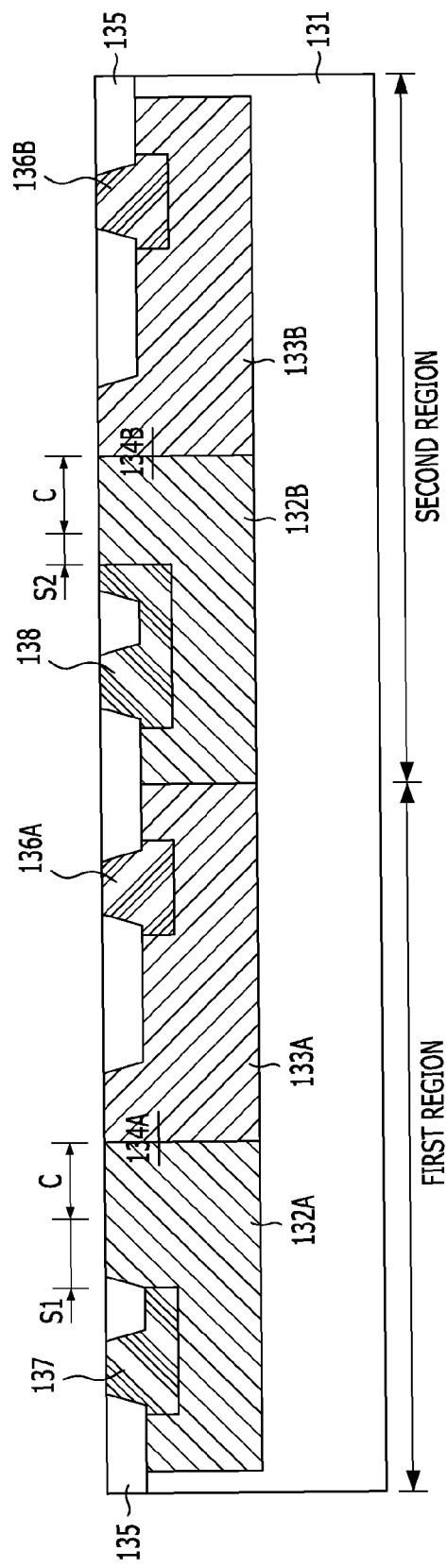
FIGS. 7A to 7D are diagrams illustrating cross-sectional views of a semiconductor device for describing a method for fabricating the semiconductor device in accordance with another embodiment of the present disclosure.

Referring to FIG. 7A, a first conductive-type impurity and a second conductive-type impurity are implanted into a first region and a second region of a substrate 131 through an ion implantation process. Thereafter, first conductive-type first deep wells 132A and 132B and second conductive-type second deep wells 133A and 133B are formed by performing a thermal treatment for activating the implanted impurities.

Thereafter, active regions 134A and 134B having a structure where the first conductive-type first deep wells 132A and 132B are junctioned with the second conductive-type second deep wells 133A and 133B over the substrate 131 are defined, and a device isolation layer 135 is formed to be partially overlapped with a region where a gate is to be formed. The device isolation layer 135 may be formed through a shallow trench isolation (STI) process.

Thereafter, first conductive-type first impurity regions 137 and 138 are formed in the first conductive-type first deep wells 132A and 132B and second conductive-type second impurity regions 136A and 136B are formed in the second conductive-type second deep wells 133A and 133B by ion-implanting the first conductive-type impurity and the second conductive-type impurity into a predetermined region of the substrate 131. The impurity doping concentration of the first conductive-type first impurity regions 137 and 138 may be higher than the impurity doping concentration of the first conductive-type first deep wells 132A and 132B.

The first conductive-type first impurity regions 137 and 138 are formed by ion-implanting the first conductive-type impurity into the first conductive-type first deep wells 132A and 132B. The threshold voltage characteristic desired by devices to be formed in the first region and the second region can be secured by forming the first conductive-type first impurity regions 137 and 138 spaced apart from the region where a channel region C is to be formed by predetermined distances S1 and S2.

To take an example, in a case where the active regions 134A and 134B of the first region and the second region have the same impurity doping concentration; semiconductor devices to be formed in the first region and the second region to have the same threshold voltage level; and a gate insulation layer formed in the first region is thicker than a gate insulation layer to be formed in the second region, the threshold voltage characteristics desired by the semiconductor devices to be formed in the first region and the second region may be acquired in the subsequent process by forming the distance S1 between the first conductive-type first impurity region 137 formed in the first region and the region where the channel region C is to be formed to be longer than the distance S2 between the first conductive-type first impurity region 138 formed in the second region and the region where the channel region C is to be formed.

Figure 7B:
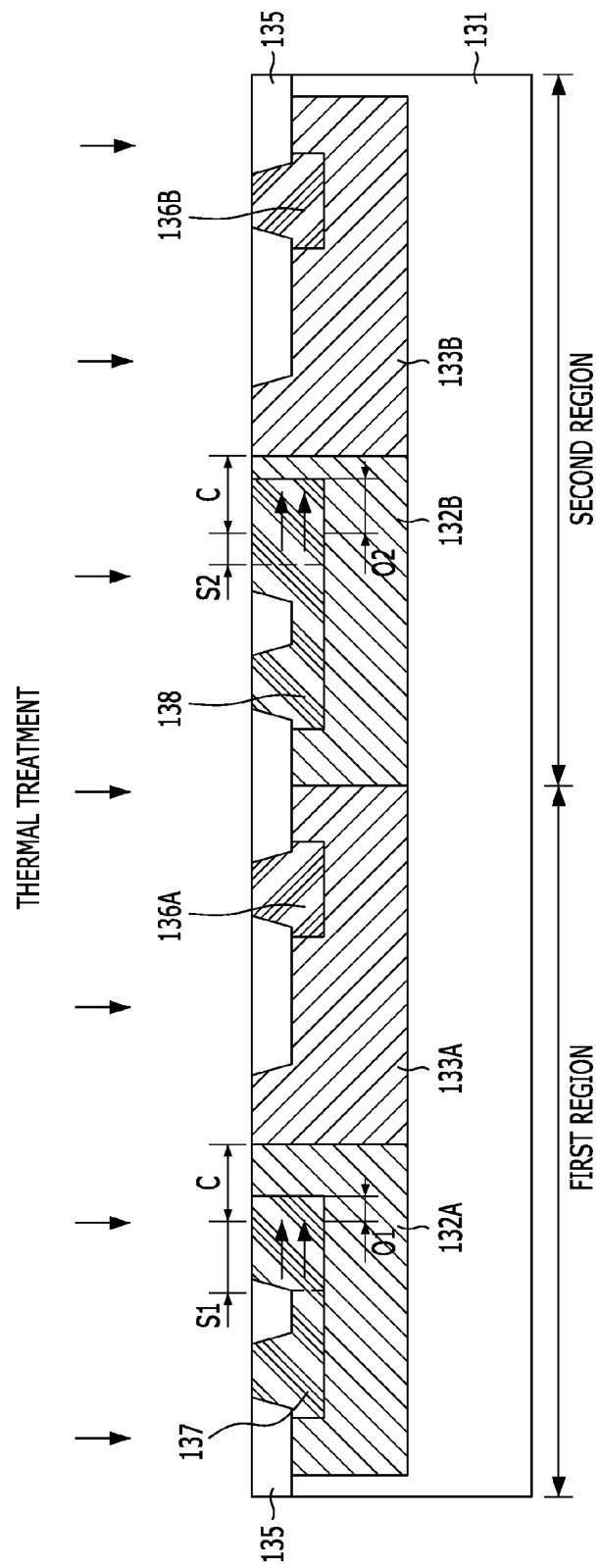

Referring to FIG. 7B, a thermal treatment is performed to activate the impurities implanted into the first conductive-type first impurity regions 137 and 138 and the second conductive-type second impurity regions 136A and 136B. The thermal treatment may be performed at a lower temperature than the thermal treatment for forming the first conductive-type first deep wells 132A and 132B and the second conductive-type second deep wells 133A and 133B.

Overlap regions O1 and O2 where the first conductive-type first impurity regions 137A and 138A are overlapped with the channel region C are formed as the impurities implanted into the first conductive-type first impurity regions 137 and 138 are diffused during the thermal treatment. Since the first conductive-type first impurity regions 137 and 138 are formed of an impurity having the same conductive type, the diffusion distances during the thermal treatment may be the same or similar. Therefore, the line widths (or areas) of the overlap regions O1 and O2 may be controlled based on the spaced distance between the first conductive-type first impurity regions 137 and 138 and the region where the channel region C is to be formed. Accordingly, the threshold voltage characteristic desired by a semiconductor device to be formed in each region may be acquired.

For example, in a case where the active regions 134A and 134B of the first region and the second region have the same impurity doping concentration; semiconductor devices to be formed in the first region and the second region to have the same threshold voltage level; and a gate insulation layer formed in the first region is thicker than a gate insulation layer to be formed in the second region, the threshold voltage characteristics desired by the semiconductor devices to be formed in the first region and the second region may be acquired by forming the distance S1 between the first conductive-type first impurity region 137 formed in the first region and the region where the channel region C is to be formed to be longer than the distance S2 between the first conductive-type first impurity region 138 formed in the second region and the region where the channel region C is to be formed, and also forming the line width (or an area) of the overlap region O1 formed in the first region wider than the line width (or an area) of the overlap region O2 formed in the second region because the first conductive-type first impurity regions 137 and 138 of each region have the same or similar diffusion distance under the same thermal treatment condition.

In addition, for example, since the impurity doping concentrations of the first conductive-type first impurity regions 137 and 138 within the overlap regions O1 and O2 have a slope as the overlap regions O1 and O2 are formed through the diffusion occurring during the thermal treatment, it is possible to prevent the breakdown voltage characteristic from being deteriorated more effectively.

Meanwhile, for the sake of convenience in description, the drawing of FIG. 7B shows the first conductive-type first impurity regions 137 and 138 diffused only toward the channel region C during the thermal treatment described above. In short, although not illustrated in the drawing, the first conductive-type first impurity regions 137 and 138 and the second conductive-type second impurity regions 136A and 136B may be diffused in the horizontal direction and the vertical direction during the thermal treatment.

Figure 7C:
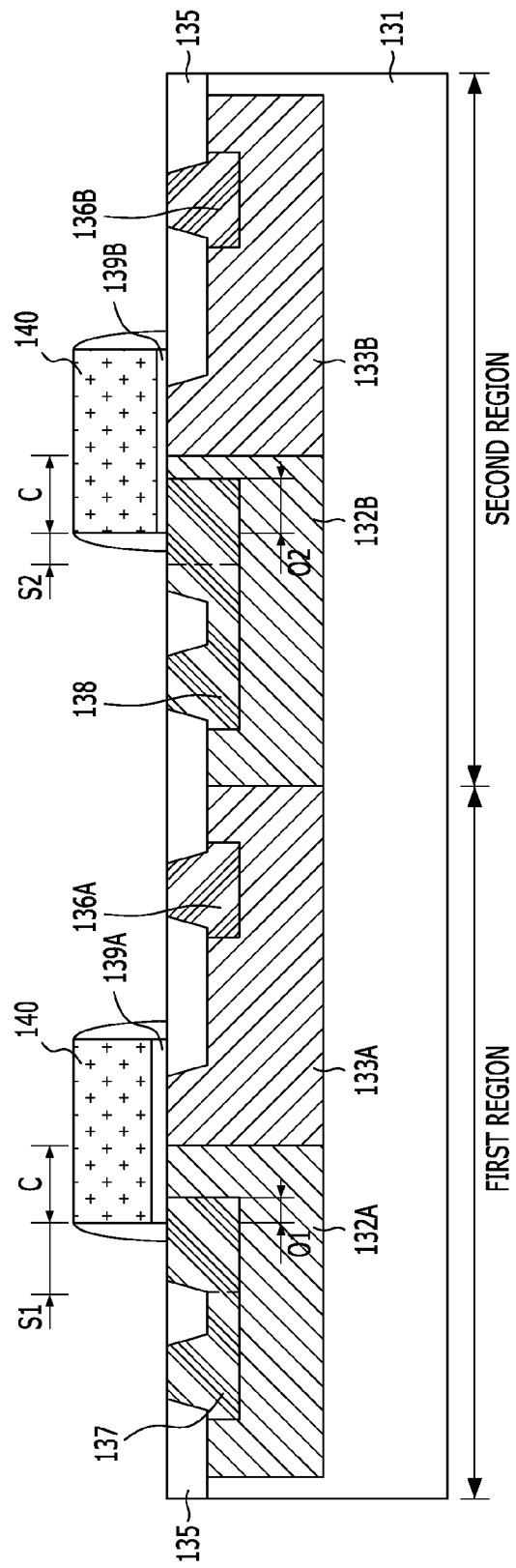

Referring to FIG. 7C, gate insulation layers 139A and 139B are formed over the substrate 131. The thickness T1 of the gate insulation layer 139A formed over the first region of the substrate 131 is greater than the thickness T2 of the gate insulation layer 139B formed over the second region of the substrate 131 (T1>T2).

Thereafter, a gate conductive layer is deposited over the substrate 131. Then, a gate having a structure where the gate insulation layers 139A and 139B and a gate electrode 140 are sequentially stacked is formed to cross both the first conductive-type first deep wells 132A and 132B and the second conductive-type second deep wells 133A and 133B in each region by sequentially etching the gate conductive layer and the gate insulation layers 139A and 139B.

Figure 7D:
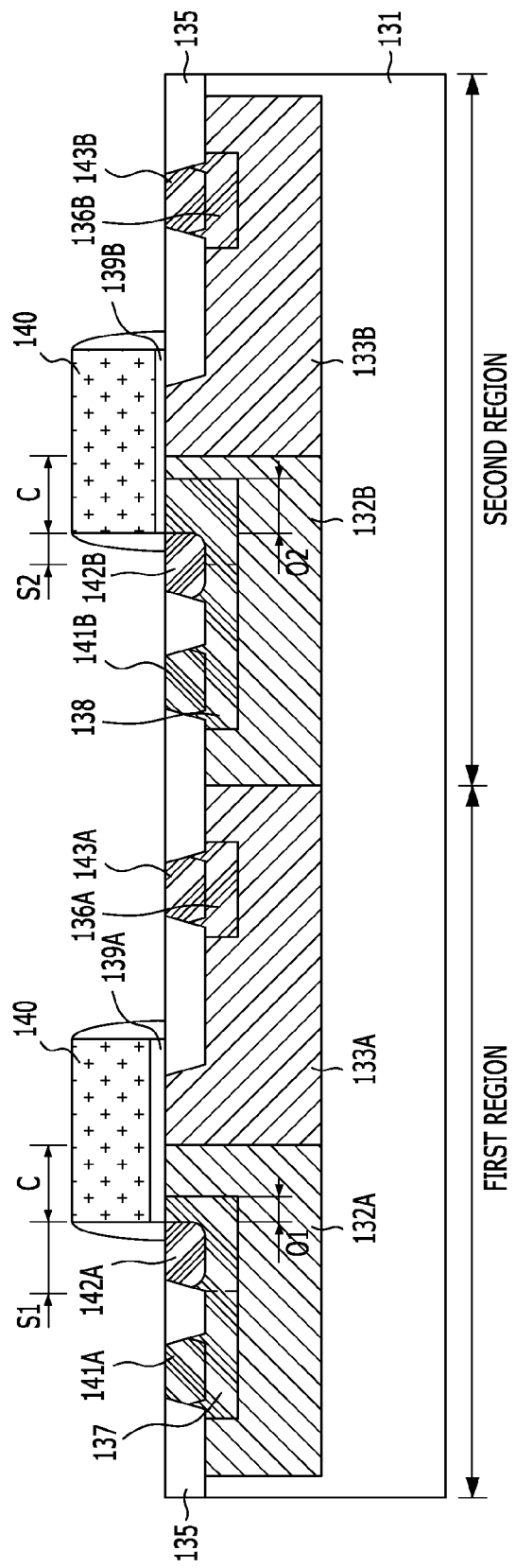

Referring to FIG. 7D, source regions 142A and 142B are formed to be arrayed at one end of one side of the gate electrode 140 by ion-implanting the second conductive-type impurity into the substrate 131, for example, into the first conductive-type first deep wells 132A and 132B. Also, drain regions 143A and 143B are formed to be spaced apart from one end of another side of the gate electrode 140 by a predetermined distance by ion-implanting the second conductive-type impurity into the substrate 131, for example, into the second conductive-type second impurity regions 136A and 136B.

Thereafter, first conductive-type pickup regions 141A and 141B are formed to be spaced apart from the source regions 142A and 142B by a predetermined distance by ion-implanting the first conductive-type impurity into the first conductive-type first impurity regions 137A and 138A.

Thereafter, a thermal treatment is performed to activate the impurities implanted into the first conductive-type pickup regions 141A and 141B, the source regions 142A and 142B, and the drain regions 143A and 143B.

Hereinafter, a semiconductor device for controlling power in accordance with another embodiment of the present disclosure is provided.

Provided in the example below is a high voltage semiconductor device that can prevent deteriorations of operational characteristics due to a local decrease of an impurity doping concentration of a channel region adjacent to a device isolation region in a channel width direction. According to an aspect, the operational characteristics may be secured by expanding an impurity region formed to surround a pickup region in such a manner that an overlap region is formed where the impurity region and a gate electrode are partially overlapped while the overlap region is spaced apart from an active region by a predetermined distance.

As an illustration, an extended drain MOS (EDMOS) transistor having an N channel will be described. In the following description, a first conductive type is a P type while a second conductive type is an N type. Again, it is understood that the teachings provided herein may be applied to an EDMOS transistor having a P channel In this case, the first conductive type is an N type while the second conductive type is a P type.

Figure 8A:
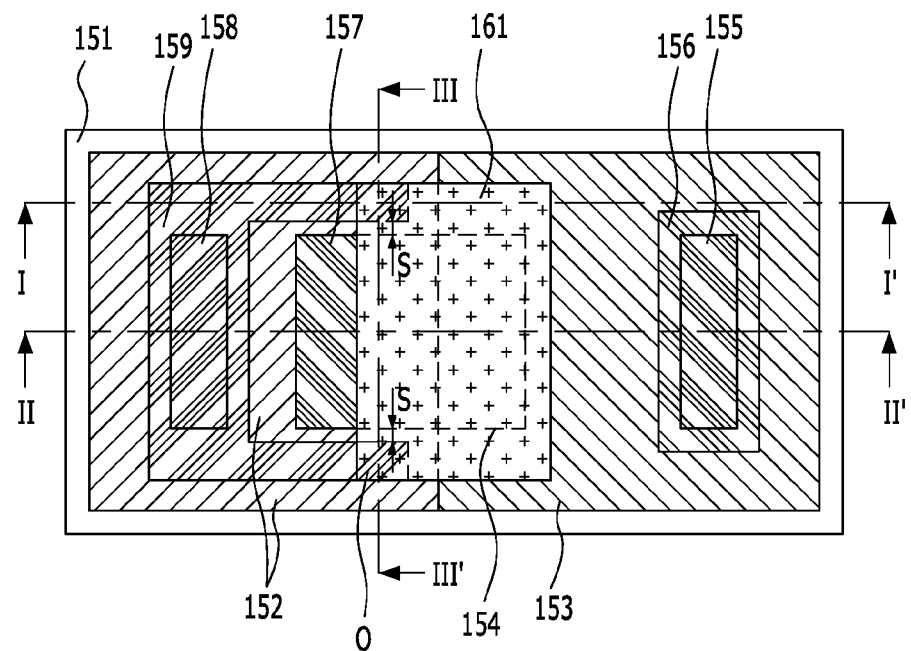
FIGS. 8A and 8D are diagrams illustrating a semiconductor device for controlling power in accordance with another embodiment of the present disclosure.
Figure 8B:
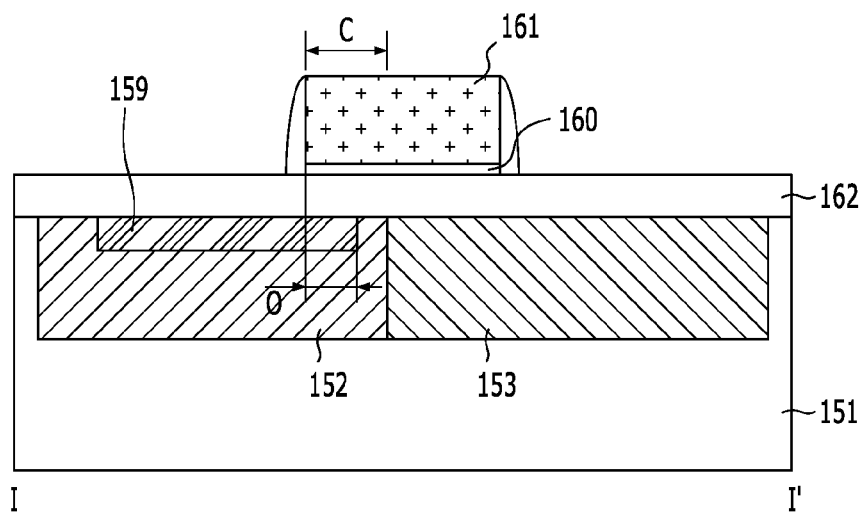
Figure 8C:
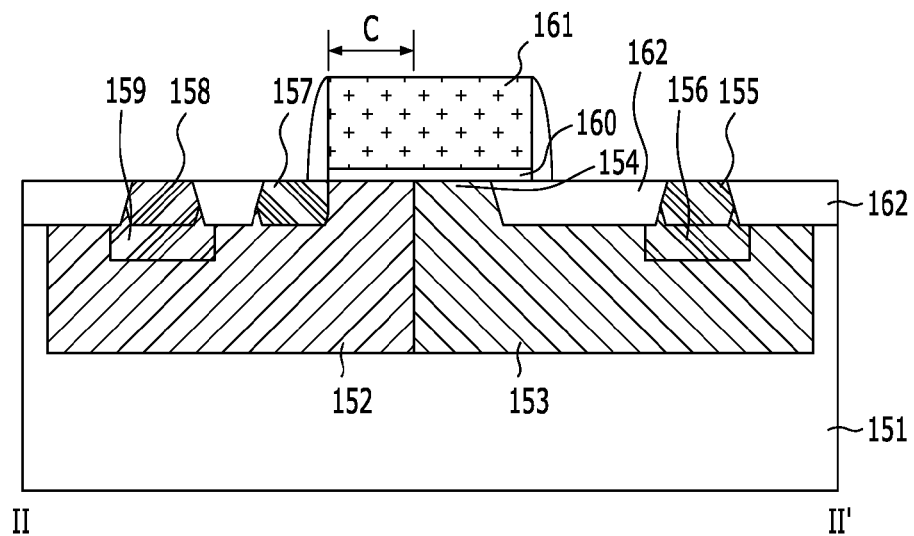
Figure 8D:
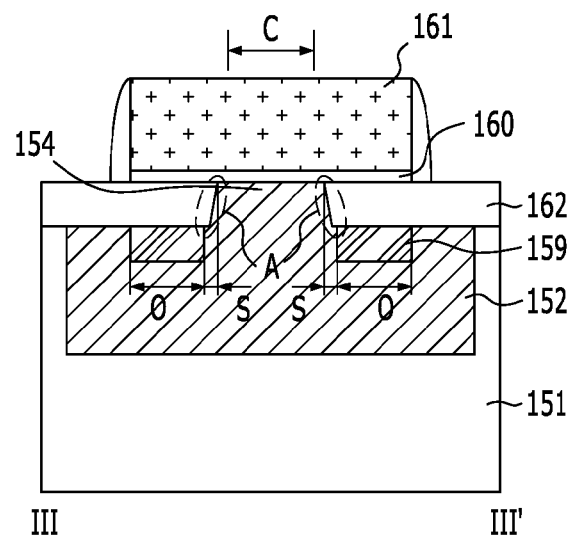

FIGS. 8A to 8D illustrate a high voltage semiconductor device in accordance with another embodiment. FIG. 8A is a plan view of the high voltage semiconductor device, and FIG. 8B is a cross-sectional view showing the high voltage semiconductor device shown in FIG. 8A taken along a line I-I'. FIG. 8C is a cross-sectional view showing the high voltage semiconductor device shown in FIG. 8A taken along a line II-II', and FIG. 8D is a cross-sectional view showing the high voltage semiconductor device shown in FIG. 8A taken along a line III-III'.

Referring to FIGS. 8A to 8D, the high voltage semiconductor device includes an EDMOS transistor. The EDMOS transistor includes a first conductive-type first well 152 and a second conductive-type second well 153 formed over a substrate 151, an active region 154, a gate electrode 161, a gate insulation layer 160, a second conductive-type source region 157, a first conductive-type pickup region 158, a first conductive-type first impurity region 159, a second conductive-type drain region 155, and a second conductive-type second impurity region 156.

The active region 154 is defined by a device isolation layer 162 formed over the substrate 151 and have a structure where the first conductive-type first well 152 and the second conductive-type second well 153 are junctioned. The gate electrode 161 crosses over both a portion of the first conductive-type first well 152 and a portion of the second conductive-type second well 153 over the substrate 151. The gate insulation layer 160 is interposed between the gate electrode 161 and the substrate 151. The second conductive-type source region 157 is formed over the first conductive-type first well 152 to be arrayed at one end of one side of the gate electrode 161. The first conductive-type pickup region 158 is formed over the first conductive-type first well 152 to be spaced apart from the second conductive-type source region 157 by a predetermined distance. The first conductive-type first impurity region 159 is formed over the first conductive-type first well 152 to surround the first conductive-type pickup region 158. The second conductive-type drain region 155 is formed over the second conductive-type second well 153 to be spaced apart from one end of another side of the gate electrode 161. The second conductive-type second impurity region 156 is formed over the second conductive-type second well 153 to surround the second conductive-type drain region 155.

The first conductive-type first impurity region 159 improves a contact characteristic between the first conductive-type first well 152 and the first conductive-type pickup region 158. Also, the first conductive-type first impurity region 159 compensates a local decrease of the impurity doping concentration of the impurities in a channel region C. The first conductive-type first impurity region 159 may have a higher impurity doping concentration than the first conductive-type first well 152, and it may have a lower impurity doping concentration than the first conductive-type pickup region 158. The second conductive-type second impurity region 156 may serve as an extended second conductive-type drain region 155 to improve the stability of the second conductive-type drain region 155 between operations. The second conductive-type second impurity region 156 may have a higher impurity doping concentration than the second conductive-type second well 153, and it may have a lower impurity doping concentration than the second conductive-type drain region 155. Also, the device isolation layer 162 may be formed through a shallow trench isolation (STI) process, and the device isolation layer 162 between the gate electrode 161 and the second conductive-type drain region 155 may have a partially overlapped structure in the lower portion of the gate electrode 151.

In one example embodiment, an overlap region O where the first conductive-type first impurity region 159 is overlapped with the gate electrode 161 within an inactive region other than the active region 154 is formed by extending (or expanding) the first conductive-type first impurity region 159, and the overlap region O is spaced apart from the active region 154 by a predetermined distance S in the direction of channel width which may prevent the operational characteristic from being deteriorated as the impurity doping concentration of a channel region C adjacent to the device isolation layer 162 is locally decreased in the direction of the channel width, which is III-III' direction. The channel region C may be defined as a surface area of the substrate 151 where the gate electrode 161 is overlapped with the first conductive-type first well 152 in the active region 154, and the inactive region may be defined as a region where the first conductive-type first well 152, the second conductive-type second well 153 and the device isolation region 162 are formed other than the active region 154.

For example, as shown in FIG. 8D, an impurity doping the first conductive-type first well 152 in the direction of channel width, e.g., boron, may segregate a device isolation layer 162 and as a result, the doping concentration of the channel region C adjacent to the device isolation layer 162 may be decreased locally (see a portion marked with 'A' in FIG. 8D).

However, the gate electrode 161 is formed over the substrate 151 of the inactive region, which is a region other than the active region 154, and the first conductive-type first impurity region 159 are overlapped to provide the overlap region O spaced apart from the active region 154 by the predetermined distance S. That is, the overlap region O is positioned in the exterior of the channel region C. Accordingly, the impurity doping concentration locally decreased in the channel region C adjacent to the device isolation layer 162 may be compensated for. Under this embodiment, is may be possible to prevent a variation of threshold voltage or a hump effect due to the decreasing of the impurity doping concentration in the channel region C adjacent to the device isolation layer 162, and thus prevent the operational characteristic of the semiconductor device from being deteriorated due to the variation of threshold voltage or the hump effect.

In the example of FIGS. 8A to 8D, the overlap region O is formed to be spaced apart from the active region 154 by the predetermined distance S so to prevent variation of a predetermined threshold voltage. The predetermined threshold voltage may be varied when the overlap region O contacts the active region 154. That is, the overlap region O may be extended to the channel region C in a manner such that the predetermined threshold voltage is varied. For example, when the overlap region O contacts the active region 154 or the overlap region O is extended to the channel region C, since the first conductive-type first impurity region 159 has a higher impurity doping concentration than the first conductive-type first well 152, the impurity doping concentration of the channel region C may be increased. Thus, the threshold voltage may be increased beyond the predetermined threshold voltage due to the overlap region O.

The overlap region O is positioned in a region where the first conductive-type first well 152 in the inactive region and the gate electrode 161 are overlapped, and the overlap region O is formed to be apart from an interface between the first conductive-type first well 152 and the second conductive-type second well 153. Accordingly, it may be possible to prevent a deterioration of a breakdown voltage BV characteristic. When the overlap region O is extended to a region where the second conductive-type second well 153 in the inactive region and the gate electrode 161 are overlapped, or the overlap region O is formed to contact the interface between the first conductive-type first well 152 and the second conductive-type second well 153, because the first conductive-type first impurity region 159 has a higher impurity doping concentration than the first conductive-type first well 152, the breakdown voltage BV characteristic of the semiconductor device may be affected in a region where the first conductive-type first impurity region 159 contact the second conductive-type second well 153.

In addition, the impurity doping concentration of the first conductive-type first impurity region 159 within the overlap region O may have a slope. When the impurity doping concentration of the first conductive-type first impurity region 159 within the overlap region O has a slope, the impurity doping concentration of the first conductive-type first impurity region 159 within the overlap region O may be increased as it becomes farther from the interface between the first conductive-type first well 152 and the second conductive-type second well 153. Thus, the deterioration of the breakdown voltage characteristic may be prevented. When the impurity doping concentration of the first conductive-type first impurity region 159 within the overlap region O is formed to have a slope, an impurity doping concentration may be maintained low in a channel region C adjacent to a drift region, i.e., a region adjacent to the interface between the first conductive-type first well 152 and the second conductive-type second well 153 under the gate electrode 161. Thus, the deterioration of the breakdown voltage characteristic may be prevented. The area ranging from a point where the channel region C ends, i.e., the interface between the first conductive-type first well 152 and the second conductive-type second well 153 under the gate electrode 161, to the second conductive-type drain region 155 may be referred to as the drift region.

It is understood that embodiments and teachings described above may not be mutually exclusive and that suitable results may be achieved by providing an embodiment in which one or more aspects of the above described embodiments or teachings are utilized. It is understood that suitable results may also be achieved although a trade-off in advantages may be involved when utilizing one or more aspects of the above described embodiments or teachings.

For example, suitable results may be achieved by providing an embodiment in which a second region of the embodiment of FIG. 2A is provided or modified to correspond to the embodiment of FIG. 8A. As another example, suitable results may be achieved by providing an embodiment in which an overlap region O2 of the embodiment of FIG. 4A is provided or modified to correspond to an overlap region O of the embodiment of FIG. 8A, such that a predetermined distance S is provided for the overlap region O2 of FIG. 4A. As yet another example, referring to FIGS. 2A and 2B, suitable results may be achieved by providing an embodiment in which a first type first impurity region 39A is extended near or as far as, but not overlapping with, an active region 34A. As still another example, referring to FIGS. 3A and 3B, suitable results may be achieved by providing an embodiment in which a first type first impurity region 59A is extended near or as far as, but not overlapping with, an active region MA; that is, O1 and O2 may be adjusted such that O1 extends less or does not overlap with the active region MA. The above examples have been provided as a non-limiting illustration only and other embodiments may be possible.

According to certain example(s) described above, a semiconductor device may be provided capable of realizing suitable threshold voltage and breakdown voltage characteristics while also reducing hump effect induced change in the operational characteristics of the semiconductor device by the inclusion of first and second overlap regions O1 and O2. According to one or more aspects of the present disclosure, it is possible to secure the threshold voltage characteristics desired by a semiconductor device while also maintaining sufficient breakdown characteristics by providing a region of overlap between the impurity region and the gate electrode. According to one or more aspects of the present disclosure, it is also possible to reduce the number of the processing steps required for the fabrication of a semiconductor device, allowing a simpler, cheaper and/or faster fabrication. Further, according to one or more aspects of the present disclosure, by the inclusion of a region of overlap between the impurity region and the gate electrode in the inactive region(s) of the semiconductor device, it is possible to minimize the effects the localized reduction of the impurity doping concentration in the channel region adjacent the device isolation layer has on the operational characteristics of the resulting semiconductor device.

According to certain method(s) for fabricating a semiconductor device described above, it is possible to more easily secure the threshold voltage characteristic desired by each transistor while maintaining the breakdown voltage characteristic by forming overlap regions O1 and O2 in a semiconductor device. According to one or more aspects of the present disclosure, it is possible to acquire the threshold voltage characteristic desired by each transistor through a one-time ion implantation process performed for each transistor without forming a threshold voltage control layer. According to one or more aspects of the present disclosure, a method for fabricating a semiconductor device can be simplified, thereby reducing the production unit cost and production time. Also, with the impurity doping concentrations of first conductive-type first impurity regions within the overlap regions O1 and O2 formed to have a slope, the breakdown voltage characteristic may be more effectively secured.

Also according to certain example(s) described above, a semiconductor device may be provided to have an overlap region O where a first conductive-type first impurity region is overlapped with a gate electrode within an inactive region other than an active region, and thus, the deterioration of the operational characteristics of the semiconductor device may be prevented due to a variation of the threshold voltage and a hump effect as the impurity doping concentration of a channel region adjacent to a device isolation layer in the direction of a channel width is locally decreased. According to one or more aspects of the present disclosure, the overlap region O may be spaced apart from the active region by a predetermined distance in the direction of a channel width so as to prevent the deterioration of the operational characteristics of the semiconductor device due to the variation of the threshold voltage and the hump effect. According to one or more aspects of the present disclosure, the overlap region O may be provided so as to not contact to an interface between a first conductive-type first well and a second conductive-type second well. Accordingly, the deterioration of the breakdown voltage characteristic by the overlap region O may be prevented. Also, the impurity doping concentration of the first conductive-type first impurity region within the overlap region O may be provided to have to a slope to further prevent the deterioration of the breakdown voltage characteristic by the overlap region O.

While the disclosure has been particularly shown and described with reference to several embodiments thereof with particular details, it will be apparent to one of ordinary skill in the art that various changes may be made to these embodiments without departing from the principles and spirit of the disclosure, the scope of which is defined in the following claims and their equivalents. That is, a number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device, comprising:
    an active region configured in or over a substrate to include a first conductive-type first deep well and a second conductive-type second deep well that form a junction therebetween;
    a gate electrode extending over the junction and over a portion of the first conductive-type first deep well and a portion of the second conductive-type second deep well;
    a gate insulation layer interposed between the gate electrode and the substrate;
    a second conductive-type source region configured in the first conductive-type first deep well on one side of the gate electrode;
    a second conductive-type drain region configured in the second conductive-type second deep well on another side of the gate electrode;
    a first conductive-type first impurity region configured in the first conductive-type first deep well, the first conductive-type first deep well having a greater depth than the first conductive-type first impurity region;
    a device isolation layer configured over the substrate to define boundaries of the active region; and
    a first conductive-type pickup region configured in the first conductive-type first impurity region, at least a portion of the device isolation layer disposed between the second conductive-type source region and the first conductive-type pickup region,
    wherein the first conductive-type first impurity region has a greater depth than the portion of the device isolation layer disposed between the second conductive-type source region and the first conductive-type pick-up region and encompasses the first conductive-type pick-up region, the second conductive-type source region, and the portion of the device isolation layer disposed therebetween in a cross-sectional view, and surrounds both the first conductive-type pick-up region and the second conductive-type source region in a plan view, the first conductive-type first impurity region extending toward the junction in such a manner as to form a first overlap region in which the first conductive-type first impurity region overlaps with a portion of the gate electrode and/or a portion of the second conductive-type source region.

2. The semiconductor device of claim 1, wherein a threshold voltage level of the semiconductor device is directly proportional to an impurity doping concentration of the active region or to a thickness of the gate insulation layer.

3. The semiconductor device of claim 2, wherein the threshold voltage level increases with an increase in an area of the first overlap region.

4. The semiconductor device of claim 1, wherein the first conductive-type first impurity region has an impurity doping concentration that is higher than that in the first conductive-type first deep well.

5. The semiconductor device of claim 1, wherein the first overlap region is formed in a manner in which the first conductive-type first impurity region overlaps with a portion of the gate electrode in the active region.

6. The semiconductor device of claim 5, wherein the first overlap region is within a positional range from the second conductive-type source region to the junction between the first conductive-type first deep well and the second conductive-type second deep well.

7. The semiconductor device of claim 5, wherein at least one of a line width of the first overlap region and an area of the first overlap region increase gradually from the second conductive-type source region toward the second conductive-type drain region.

8. The semiconductor device of claim 1, wherein an impurity doping concentration of the first conductive-type first impurity region within the first overlap region has a slope.

9. The semiconductor device of claim 8, wherein the impurity doping concentration of the first conductive-type first impurity region within the first overlap region decreases gradually from the second conductive-type source region toward the second conductive-type drain region.

10. The semiconductor device of claim 1, wherein the second conductive-type source region is formed in the first conductive-type first deep well adjacent one side edge of the gate electrode, the second conductive-type drain region being formed in the second conductive-type second deep well and being spaced apart from, and on opposite side from the second conductive-type source region, of the gate electrode.

11. The semiconductor device of claim 1, further comprising a second conductive-type second impurity region configured in the second conductive-type second deep well to surround the second conductive-type drain region.

12. The semiconductor device of claim 11, wherein the device isolation layer is formed through a shallow trench isolation (STI) process.

13. The semiconductor device of claim 12, wherein at least a portion of the device isolation layer extends between the gate electrode and the second conductive-type drain region, and is partially overlapped by a portion of the gate electrode.

14. The semiconductor device of claim 1, wherein the first conductive-type pickup region is spaced apart from the second conductive-type source region in the plan view; and the gate electrode has a greater width than the first conductive-type first impurity region in a channel width direction such that the gate electrode protrudes from both sides of the first overlap region in the plan view.

* * * * *